(12) United States Patent
Hara et al.

(10) Patent No.: US 9,404,180 B2
(45) Date of Patent: Aug. 2, 2016

(54) DEPOSITION DEVICE

(75) Inventors: Masamichi Hara, Nirasaki (JP); Kaoru Yamamoto, Nirasaki (JP); Atsushi Gomi, Nirasaki (JP); Satoshi Taga, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 655 days.

(21) Appl. No.: 13/634,314

(22) PCT Filed: Mar. 8, 2011

(86) PCT No.: PCT/JP2011/055319
§ 371 (c)(1),
(2), (4) Date: Sep. 12, 2012

(87) PCT Pub. No.: WO2011/114940
PCT Pub. Date: Sep. 22, 2011

(65) Prior Publication Data
US 2013/0000558 A1 Jan. 3, 2013

(30) Foreign Application Priority Data

Mar. 16, 2010 (JP) .................................. 2010-059963
Sep. 30, 2010 (JP) .................................. 2010-220385

(51) Int. Cl.
*C23C 16/455* (2006.01)
*C23C 16/16* (2006.01)
(Continued)

(52) U.S. Cl.
CPC ............... *C23C 16/455* (2013.01); *C23C 16/16* (2013.01); *C23C 16/4412* (2013.01); *C23C 16/45591* (2013.01); *C23C 16/45593* (2013.01); *H01L 21/28556* (2013.01)

(58) Field of Classification Search
CPC ............ C23C 16/455; C23C 21/28556; C23C 16/45593; C23C 16/16; C23C 16/45591; C23C 16/4412
See application file for complete search history.

(56) References Cited

U.S. PATENT DOCUMENTS 5,106,453 A 4/1992 Benko et al.
6,055,927 A * 5/2000 Shang ................. C23C 16/4405
118/715

(Continued)

FOREIGN PATENT DOCUMENTS

JP 04-364024 A 12/1992
JP 2004-364024 A 12/1992

(Continued)

OTHER PUBLICATIONS

M. J. Ludowise, "Metalorganic chemical vapor deposition of III-V semiconductors", Journal of Applied Physics, 1985, vol. 58, p. R31-R55.

(Continued)

*Primary Examiner* — Jeffrie R Lund
(74) *Attorney, Agent, or Firm* — Abelman, Frayne & Schwab

(57) ABSTRACT

The disclosed deposition device for forming a thin film using a starter gas comprising an organic metal compound is provided with: a processing container 22; a mounting platform 28 which has a heater 34 for heating the workpiece W; a gas introduction mechanism 80 which introduces the starter gas toward the area more exterior than the outer peripheral end of the workpiece W on the mounting platform 28; an internal partition wall 90 which is disposed such that the lower end of said processing space contacts the mounting platform 28 to form gas outlets 92 between the lower portion of the space and the edges of the mounting platform 28; and a orifice forming member 96 which extends radially inward toward the mounting platform 28 and forms an orifice 98 communicating with the gas outlet 92.

6 Claims, 18 Drawing Sheets

(51) Int. Cl.
*C23C 16/44* (2006.01)
*H01L 21/285* (2006.01)

(56) References Cited

U.S. PATENT DOCUMENTS

| | | | |
|---|---|---|---|
| 6,583,064 B2 * | 6/2003 | Wicker | H01J 37/321 118/723 I |
| 6,716,287 B1 * | 4/2004 | Santiago | C23C 16/4412 118/728 |
| 8,313,578 B2 * | 11/2012 | Carducci | H01J 37/32623 118/715 |
| 8,454,749 B2 * | 6/2013 | Li | C23C 16/4401 118/715 |
| 2003/0192644 A1 * | 10/2003 | Pu | H01J 37/321 156/345.28 |
| 2003/0192646 A1 * | 10/2003 | Wu | H01J 37/32623 156/345.49 |
| 2004/0244949 A1 | 12/2004 | Fink | |
| 2007/0128861 A1 * | 6/2007 | Kim et al. | 438/680 |
| 2009/0188625 A1 * | 7/2009 | Carducci | H01J 37/32467 156/345.34 |
| 2009/0250004 A1 * | 10/2009 | Yamada et al. | 118/722 |
| 2011/0226181 A1 * | 9/2011 | Yamamoto | C23C 16/16 118/724 |
| 2012/0055403 A1 * | 3/2012 | Gomi | C23C 16/4404 118/725 |
| 2013/0000558 A1 * | 1/2013 | Hara | C23C 16/16 118/724 |
| 2015/0325432 A1 * | 11/2015 | Ishizaka | H01L 21/02107 438/758 |

FOREIGN PATENT DOCUMENTS

| | | |
|---|---|---|
| JP | 7070492 B | 7/1995 |
| JP | 2002-060944 A | 2/2002 |
| JP | 2004-346401 A | 12/2004 |
| JP | 2005-228972 A | 8/2005 |
| JP | 2009-239104 | * 10/2009 |
| JP | 2009-239104 A | 10/2009 |
| KR | 10-2008-0075111 A | 8/2008 |

OTHER PUBLICATIONS

International Search Report issued on Apr. 19, 2011 for WO 2011/114940 A1.

\* cited by examiner

FIG.6.A
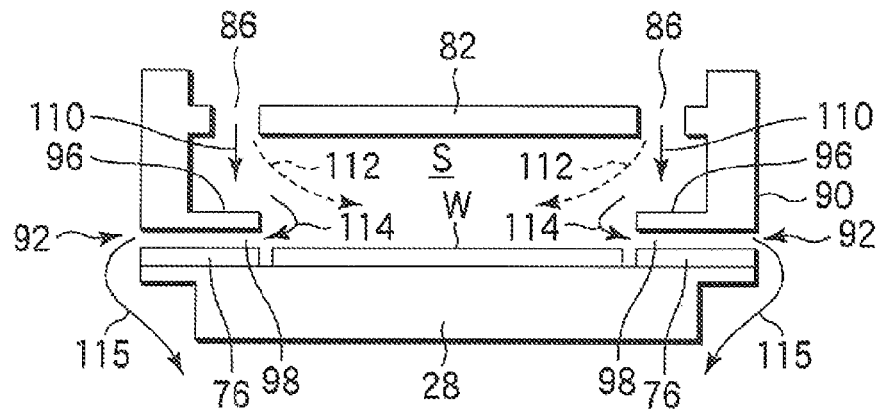
FIG.6B
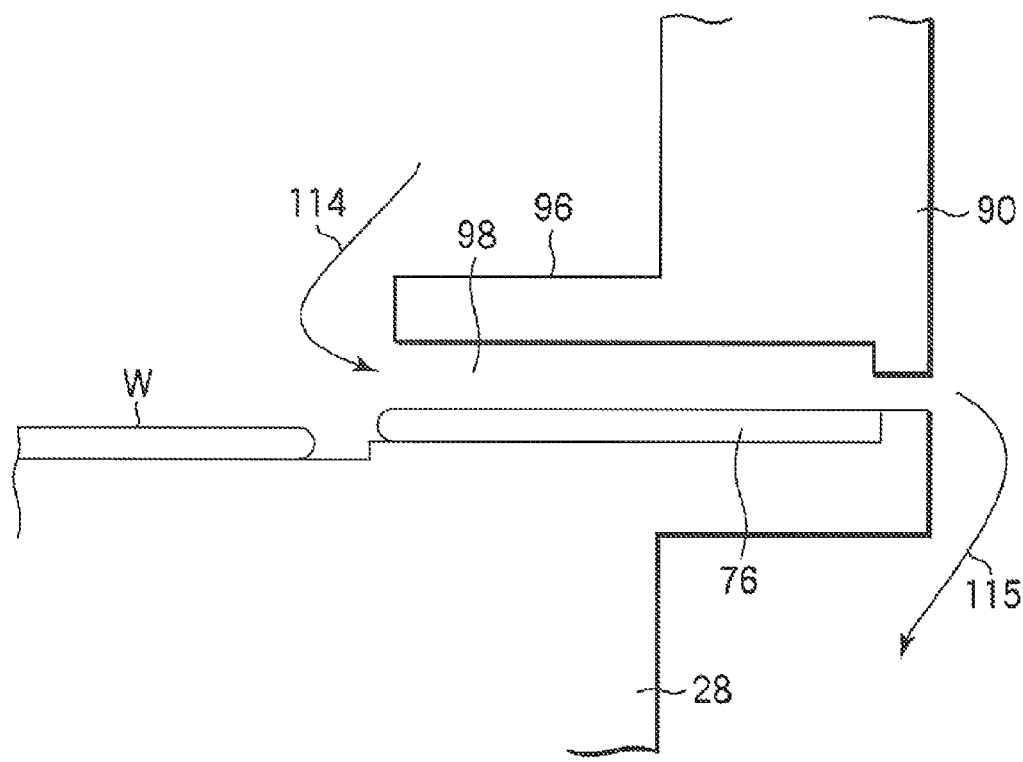

DEPOSITION DEVICE

CROSS REFERENCE TO RELATED APPLICATIONS

This application is a national phase of PCT application No. PCT/JP2011/055319, filed Mar. 8, 2011, which claims priorities to Japanese patent applications No. 2010-059963, filed on Mar. 16, 2010 and No. 2010-220385, filed on Sep. 30, 2010, all of which are incorporated herein by reference.

TECHNICAL FIELD

The present invention relates to a deposition device that forms a thin film on a workpiece, such as a semiconductor wafer, using a source gas.

BACKGROUND ART

Recently, due to a miniaturization of a semiconductor integrated circuit apparatus, a diameter of copper (Cu) via plug formed in an interlayer insulation film has been reduced from 65 nm to 45 nm. Further, it is expected that a diameter of a via plug will be further reduced to 32 nm or 22 nm in near future.

As the miniaturization is progressed in the semiconductor integrated circuit apparatus, the conventional CVD method has a difficulty in depositing a barrier metal film or Cu seed layer on a fine via hole or wiring groove in terms of a step coverage. Therefore, a deposition technique using MOCVD method or ALD method through which an excellent step coverage can be achieved draws attention. Since the interlayer insulation film (low-k film) consisting of low dielectric materials widely used recently tends to be damaged by heat, it is considered that a film deposition by MOCVD method or ALD method is carried out at a low temperature at which low-k film is not damaged.

In the meantime, since a metal compound in which metal atoms are bonded with an organic group is generally used as a raw material in the MOCVD method or ALD method, impurities are likely to remain in a formed film. Therefore, even though the formed film seems to have an excellent step coverage at first glance, the quality of the film is unstable. For example, in a case where the Cu-plated seed layer is formed on Ta barrier metal film by the MOCVD method, an aggregation can be easily generated in the seed layer so that it is difficult to stably deposit a seed layer that covers the Ta barrier metal film with a uniform film thickness. When an electroplating is performed for the Cu layer using the seed layer that generated the aggregation as an electrode, potential defects are included in the Cu layer which fills the wiring groove or via hole to cause problems, such as for example, an increase in electrical resistance as well as a degradation of either electro-migration resistance or stress migration tolerance.

Accordingly, there has been proposed a method in which a barrier metal film or seed layer is directly formed on the interlayer insulation layer by MOCVD method using metal carbonyl raw material (e.g., Patent Documents 1 and 2). The metal carbonyl raw material can be easily pyrolyzed at a relatively low temperature to form a metal film and CO gas serving as ligand of the metal carbonyl raw material is exhausted outside a deposition reaction system without remaining in the formed film, so that a high-quality barrier metal film or seed layer having very few impurities can be formed. With the above-described method, it is possible to form W film using, for example, $W(CO)_6$, as the barrier metal film, or Ru film using, for example, $Ru_3(CO)_{12}$, as the seed layer.

In this case, since the metal carbonyl raw material has a characteristic that decomposes very easily at a relatively low temperature, CO gas having a decomposition suppressing function is utilized as a carrier gas. A source gas consisting of the metal carbonyl raw material is supplied from a shower head installed at a ceiling part of a processing container to be deposited by, for example, CVD method, on a semiconductor wafer mounted on a mounting platform to be heated.

However, when depositing a film by supplying the metal carbonyl source gas using the shower head, a film thickness of the central portion of the semiconductor wafer which is the workpiece increases and the film thickness gradually decreases as it goes to the periphery of the semiconductor wafer.

Therefore, as a deposition device capable of avoiding the problems described above, a deposition device has been proposed in which a baffle plate is installed at a ceiling part of a processing container instead of a shower head, an annular internal partition wall is installed to surround a processing space within a processing container, and the source gas is supplied toward the area further outside than the outer peripheral end of the semiconductor wafer mounted on a mounting platform from a gas discharge port installed at the peripheral edges of the baffle part (Patent Document 3). In the deposition device, most of the source gas supplied to the processing space downwardly from the gas discharge port installed at the peripheral edges of the baffle part flows downwardly and a portion of the source gas is diffused to flow toward a central portion of the processing space, so that a thin film is formed on a surface of the semiconductor wafer which is the workpiece. In the meantime, a gas contained in the processing space is exhausted toward downward from an annular gas outlet formed between a lower end of an inner partition wall and the mounting platform.

CITATION LIST

Patent Document

[Patent Document 1] Japanese Patent Application Laid-Open No. 2002-60944
[Patent Document 2] Japanese Patent Application Laid-Open No. 2004-346401
[Patent Document 3] Japanese Patent Application Laid-Open No. 2009-239104

SUMMARY OF INVENTION

Since supplying a source gas to a central portion of the semiconductor wafer which is the workpiece is suppressed by installing the baffle plate described above, the increase of the film thickness of the central portion of the semiconductor wafer is avoided, so that a high in-plane uniformity of the film thickness can be maintained. However, since most of the gas discharged from the gas discharge port of the peripheral edge of the baffle plate is exhausted from the gas outlet and thus an amount of the source gas contributing to the film deposition becomes small, it is not possible to achieve a sufficiently high deposition rate.

The organometallic compound, such as $Ru_3(CO)_{12}$, is an expensive raw material and is thus required to be recovered and reused. However, in the apparatus as described in Patent Document 3, since the mounting platform is set to a high temperature, the source gas is decomposed at the peripheral edge of the mounting platform to cause an unnecessary film to be deposited thereon, making it difficult to recover the raw material.

Therefore, an object of the present invention is to provide a deposition device capable of achieving a good in-plane uniformity of the film thickness as well as a high deposition rate. In addition, the present invention intends to provide a deposition device capable of effectively recovering the raw material.

A first aspect of the present invention provides a deposition device for forming a thin film on a surface of a workpiece using a source gas consisting of an organometallic compound, the deposition device including: a processing container which is vacuum-exhaustible in which the workpiece is accommodated; a mounting platform accommodated in the processing container configured to mount a workpiece W and installed with a heater for heating the workpiece; a gas introduction mechanism disposed above the mounting platform to be opposed thereto and configured to introduce the source gas toward the area further outside than the outer peripheral end of the workpiece on the mounting platform; an internal partition wall which surrounds a processing space S above the mounting platform to form a boundary for the processing space and installed such that the lower end portion of the internal partition wall comes close to the mounting platform to form a gas outlet between the lower end portion of the internal partition wall and the peripheral edges of the mounting platform; and an orifice forming member installed on the lower end of the internal partition wall to extend radially inward toward the mounting platform to form an orifice communicating with the gas outlet between the internal partition wall and the peripheral edge of the mounting platform.

A second aspect of the present invention provides a deposition device for forming a thin film on a surface of a workpiece using a source gas consisting of an organometallic compound, the deposition device including: a processing container which is vacuum-exhaustible in which the workpiece is accommodated; a mounting platform accommodated in the processing container configured to mount a workpiece W and installed with a heater for heating the workpiece; a gas introduction mechanism disposed above the mounting platform to be opposed thereto and configured to introduce the source gas toward the area further outside than the outer peripheral end of the workpiece on the mounting platform; an internal partition wall which surrounds a processing space S above the mounting platform to form a boundary for the processing space and installed such that the lower end portion of the internal partition wall comes close to the mounting platform to form a gas outlet between the lower end portion of the internal partition wall and the peripheral edges of the mounting platform; and an orifice forming member intervened to form an upper gap and a lower gap in the gas outlet, the inner peripheral end is disposed to extend radially inward toward the mounting platform, and the upper gap forms an orifice.

A third aspect of the present invention provides a deposition device for forming a thin film on a surface of a workpiece using a source gas consisting of an organometallic compound, the deposition device including: a processing container which is vacuum-exhaustible in which the workpiece is accommodated; a mounting platform accommodated in the processing container configured to mount a workpiece W and installed with a heater for heating the workpiece; a gas introduction mechanism disposed above the mounting platform to be opposed thereto and configured to introduce the source gas toward the area further outside than the outer peripheral end of the workpiece on the mounting platform; an internal partition wall which surrounds a processing space S above the mounting platform to form a boundary for the processing space and installed such that the lower end portion of the internal partition wall comes close to the mounting platform to form a gas outlet between the lower end portion of the internal partition wall and the peripheral edges of the mounting platform; an orifice forming member intervened to form an upper gap and a lower gap in the gas outlet, the inner peripheral end is disposed to extend radially inward toward the mounting platform, and the upper gap being form an orifice; a purge gas supply mechanism configured to supply a purge gas to the lower gap; and a cover member installed to cover the outer part of the peripheral edge of the mounting platform, and the internal partition wall, the orifice forming member and the cover member are maintained at a temperature lower than the decomposition temperature of the source gas and equal to or higher than a solidification temperature or a liquefaction temperature, and the peripheral edge of the mounting platform is maintained at a temperature at which the source gas is decomposed.

A fourth aspect of the present invention provides a deposition device for forming a thin film on a surface of a workpiece using a source gas consisting of an organometallic compound, the deposition device including: a processing container which is vacuum-exhaustible in which the workpiece is accommodated; a mounting platform accommodated in the processing container configured to mount a workpiece W and installed with a heater for heating the workpiece; a gas introduction mechanism disposed above the mounting platform to be opposed thereto and configured to introduce the source gas toward the area further outside than the outer peripheral end of the workpiece on the mounting platform; an internal partition wall which surrounds a processing space S above the mounting platform to form a boundary for the processing space and installed such that the lower end portion of the internal partition wall comes close to the mounting platform to form a gas outlet between the lower end portion of the internal partition wall and the peripheral edges of the mounting platform; and a orifice forming member installed on the lower end of the internal partition wall to extend radially inward toward the mounting platform to form an orifice communicating with the gas outlet between the internal partition wall and the peripheral edge of the mounting platform, and maintained at a temperature lower than the decomposition temperature of the source gas and higher than the solidification temperature or liquefaction temperature thereof, and the mounting platform includes a mounting platform main body having the heater for heating the workpiece, a peripheral ring member installed to be apart from the workpiece in the periphery of the mounting platform main body and of which temperature is adjusted by being partially contacted with the mounting platform main body, and a cover ring member installed to be apart from the workpiece in the periphery of the mounting platform body, and installed on the peripheral ring member.

BRIEF DESCRIPTION OF DRAWINGS

FIG. 6A is a diagram illustrating flow of a source gas within a processing container of the deposition device, according to the first embodiment of the present invention.

FIG. 6B is an enlarged diagram illustrating the surrounding regions of an orifice illustrated in FIG. 6A and a flow of a source gas flowing in the surrounding regions.

DETAILED DESCRIPTION

Hereinafter, an exemplary embodiment of a deposition device of the present invention will be described in detail with reference to the accompanying drawings.

Deposition Device According to First Embodiment

Figure 1:
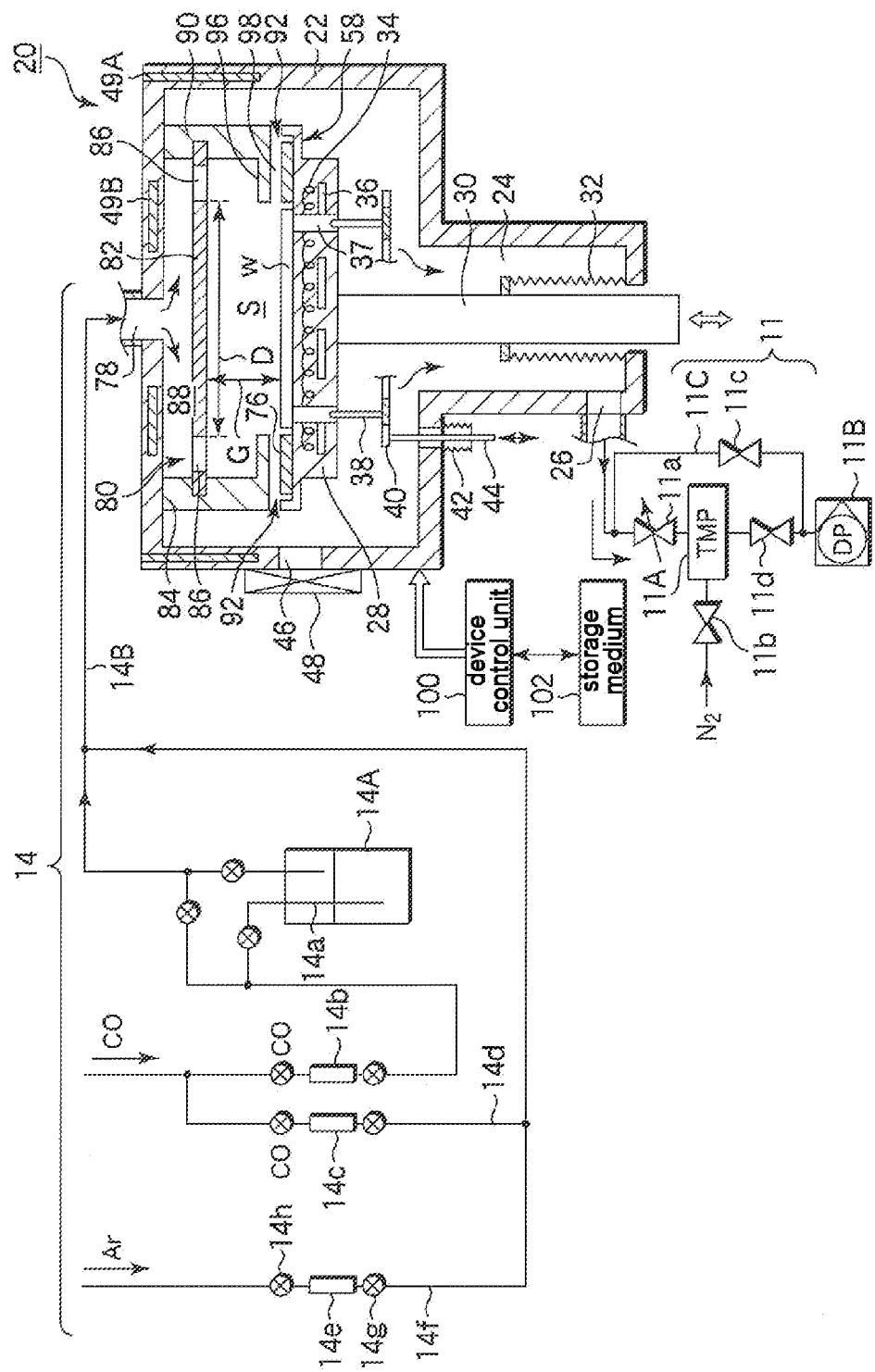
FIG. 1 is a schematic configuration view illustrating a deposition device, according to a first embodiment of the present invention.
Figure 2:
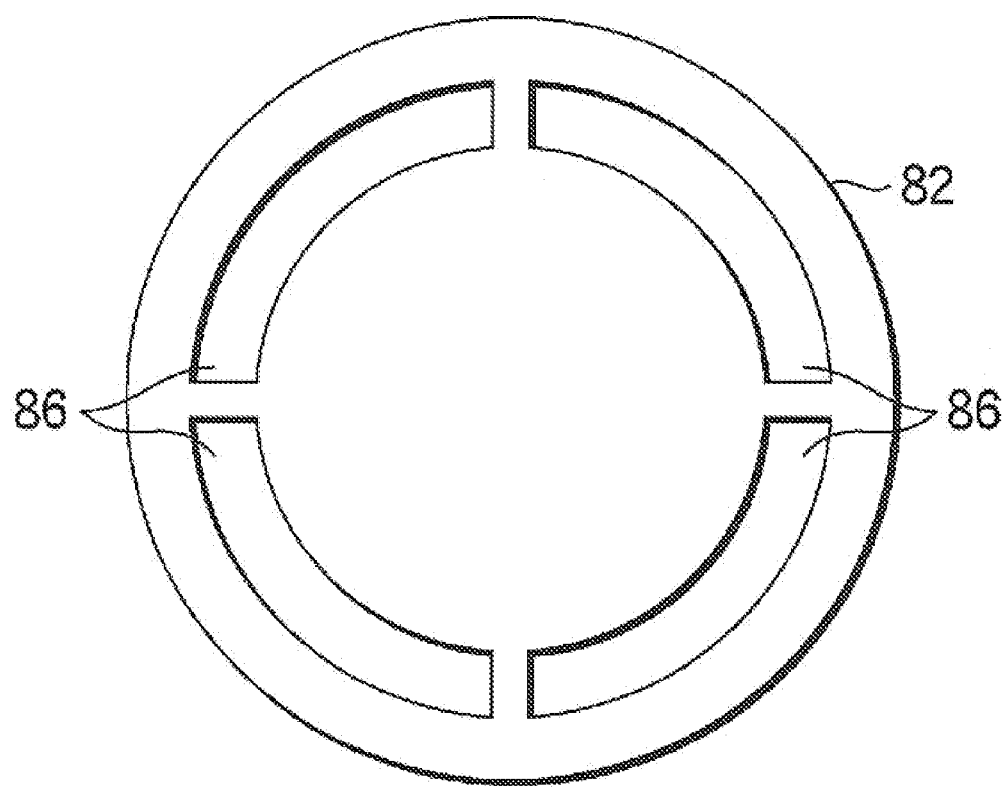
FIG. 2 is a plan view illustrating an example of a baffle plate used in the deposition device of FIG. 1.
Figure 3:
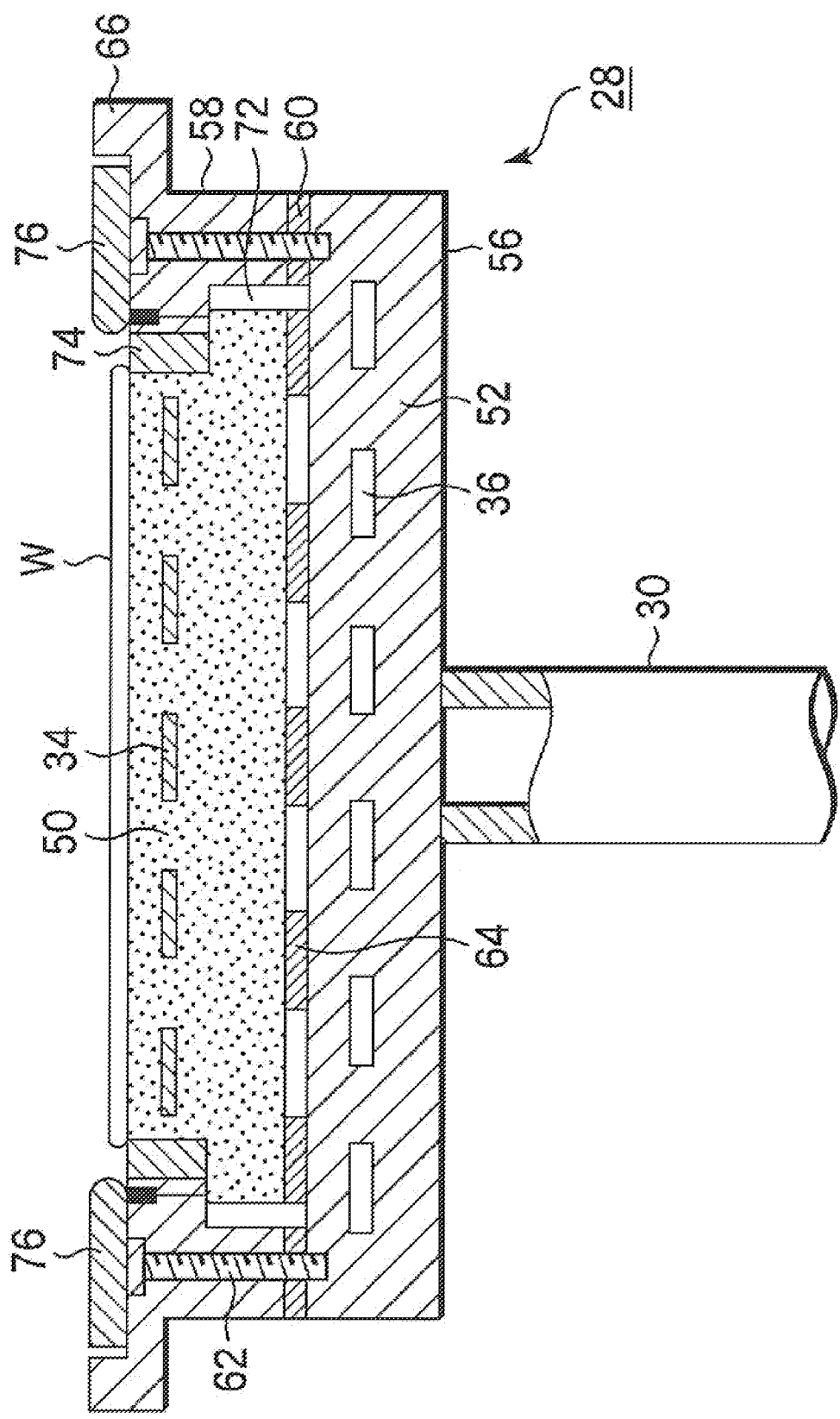
FIG. 3 is an enlarged cross-sectional view illustrating a mounting platform used in the deposition device of FIG. 1.
Figure 4:
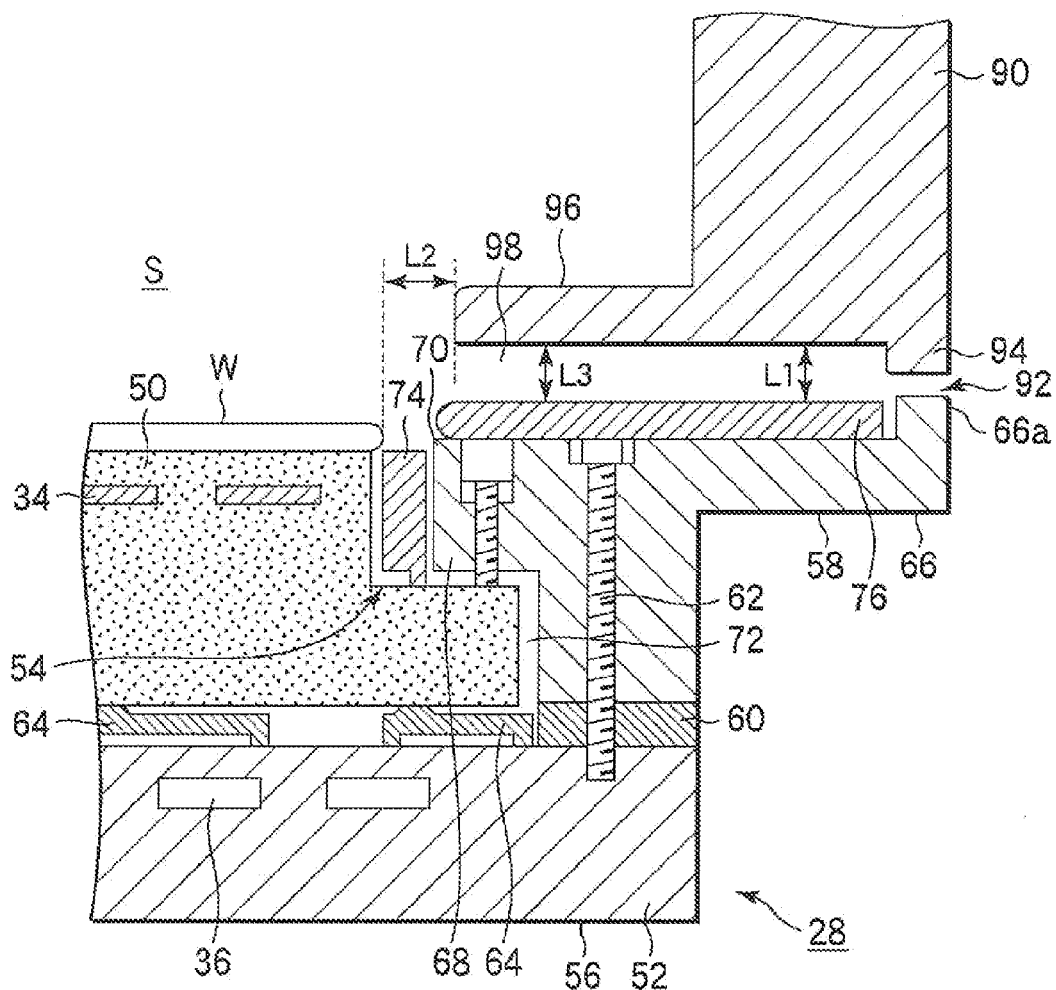
FIG. 4 is a partially enlarged cross-sectional view illustrating a portion of the mounting platform used in the deposition device of FIG. 1.
Figure 5:
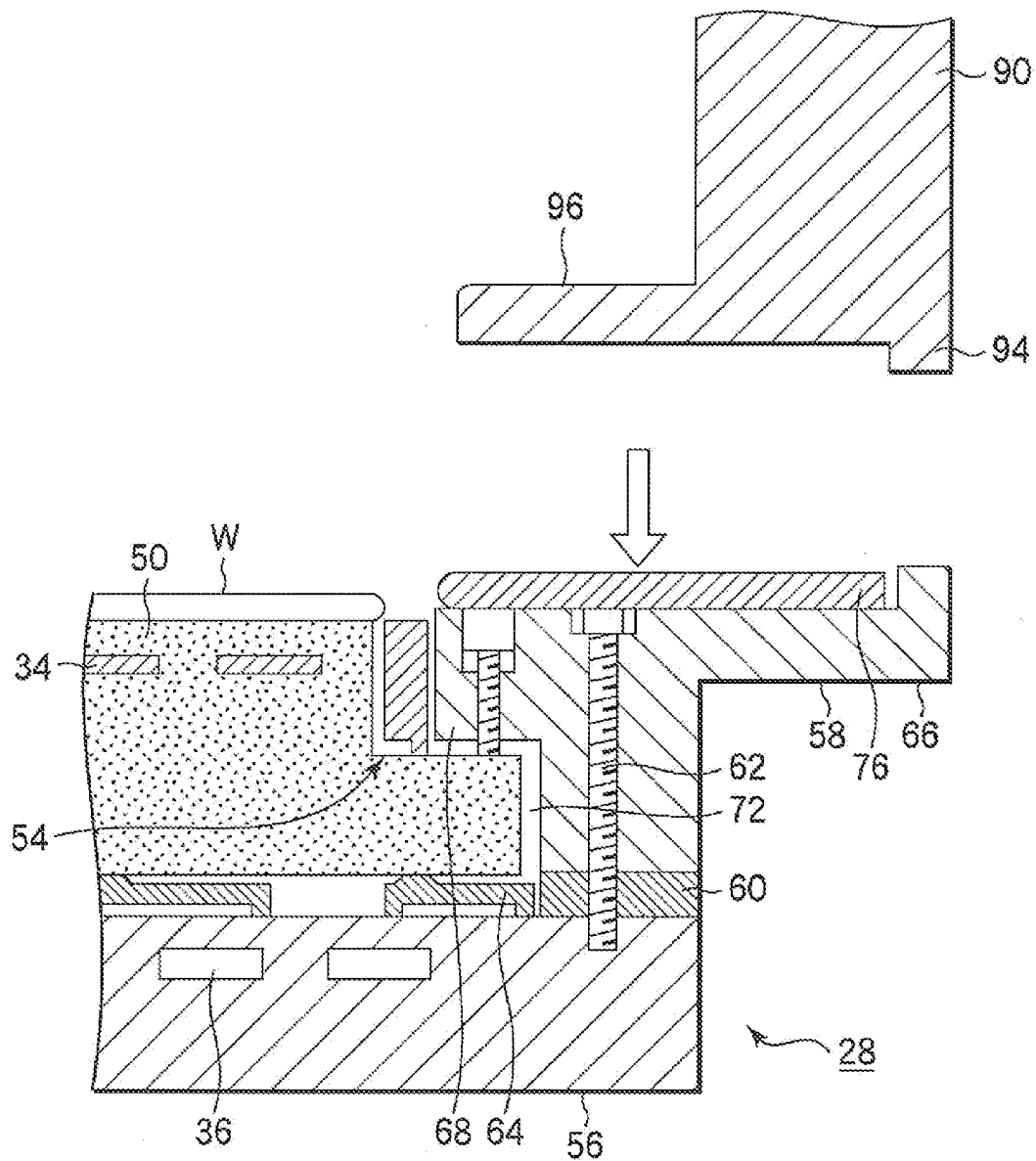
FIG. 5 is a view illustrating a state where the mounting platform is lowered down in the deposition device of FIG. 1.

FIG. 1 is a schematic configuration view illustrating a deposition device according to a first embodiment of the present invention. FIG. 2 is a plan view illustrating an example of a baffle plate used in the deposition device of FIG. 1. FIG. 3 is an enlarged cross-sectional view illustrating a mounting platform used in the deposition device of FIG. 1. FIG. 4 is a partially enlarged cross-sectional view illustrating a portion of the mounting platform used in the deposition device of FIG. 1. FIG. 5 is a view illustrating a state where the mounting platform is lowered down. Herein, a case will be exemplified where a film formed with Ru metal film is deposited using $Ru_3(CO)_{12}$, which is organometallic compound carbonyl system, as a raw material of organometallic compound and using carbon monoxide (CO) as a carrier gas.

As illustrated in FIG. 1, a deposition device 20 according to the first embodiment includes a columnar container-shaped processing container 22 made of, for example, an aluminium alloy. Processing container 22 is constituted with an upper chamber having a larger diameter and a lower chamber having a smaller diameter, and an inner space of the lower chamber serves as an exhaust space 24. An exhaust port 26 is formed at a lower side wall partitioning exhaust space 24 serving as the lower chamber, and an exhaust system 11 is connected with exhaust port 26. A mounting platform 28 on which a workpiece which is a semiconductor wafer W is mounted and held, is installed in the upper chamber of processing container 22. A gas inlet 78 which introduces gas necessary for processing into the processing container is formed at a central portion of a ceiling part of the processing container 22. A gas supply system 14 which supplies, for example, a source gas is connected with gas inlet 78. A gas introduction mechanism 80 is communicated with gas inlet 78 to be installed at an upper portion of processing container 22.

Exhaust system 11 has a configuration in which a turbo molecular pump 11A and dry pump 11B are connected in series, and nitrogen gas is supplied to turbo molecular pump 11A through a valve 11b. Variable conductance valve 11a is installed between processing container 22 and turbo molecular pump 11A to maintain the entire pressure inside the processing container 22 uniformly. An exhaust path 11C which bypasses turbo molecular pump 11A is installed to rough processing container 22 using dry pump 11B and a valve 11c is installed at exhaust path 11C, and a valve 11d is installed at downstream of turbo molecular pump 11A. A trap mechanism (not illustrated) to remove remnants contained in an exhaust gas is installed at an upstream of dry pump 11B. A heater for heating the exhaust gas, such as for example, a tape heater is installed at the exhaust path spanning to the trap mechanism of exhaust system 11 to maintain a non-reacted source gas contained in the exhaust gas at a temperature lower than the decomposition temperature of raw material and equal to or higher than the solidification temperature or liquefaction temperature, and the non-reacted source gas is recovered through the trap mechanism.

Gas supply system 14 includes a bubbler 14A vaporizing the raw material and a gas introduction line 14B guides the raw material to processing container 22. Ru carbonyl compound such as $Ru_3(CO)_{12}$ is maintained at inside bubbler 14A as the raw material, and CO gas serving as a carrier gas is supplied from a bubbling gas line 14a in which a mass flow controller (MFC) 14b is intervened to be bubbled, so that the vaporized $Ru_3(CO)_{12}$ gas can be introduced into processing container 22 through gas introduction line 14B as the source gas. CO gas as a carrier gas can be flown from a line 14d in which mass flow controller (MFC) 14c is intervened, and the source gas is transported toward processing container 22 in gas introduction line 14B by the carrier gas. A line 14f which supplies an inert gas such as Ar and in which valves 14g, 14h and MFC 14e are intervened is installed in gas supply system 14A, and the inert gas may be added to $Ru_3(CO)_{12}$ gas supplied from processing container 22 through gas introduction line 14B as needed.

Mounting platform 28 is molded, for example, in a circular plate shape in its entirety and the diameter of mounting platform 28 is larger than that of semiconductor wafer W which is mounted on the upper surface of mounting platform 28. Mounting platform 28 is attached and fixed to an upper end portion of a post 30 which is made of, for example, metal and erected from the bottom side of processing container 22. Post 30 passes through the bottom forming the boundaries of exhaust space 24 to be extended downward and allows mounting the platform 28 to be lifted or lowered down entirely in a vertical direction by an actuator (not illustrated) to stop at a location. A bellows 32 made of metal to be extendable and contractible is installed at a penetrating part of post 30, so that mounting platform 28 may be lifted or lowered down while maintaining airtightness.

A heater 34, for example, a tungsten wire heater or a carbon wire heater as a heating unit for the workpiece is buried within mounting platform 28, and semiconductor wafer W is heated by heater 34. A refrigerant passage 36 through which refrigerant that cools the lower portion or side portion of mounting platform 28 to adjust a temperature thereof flows is installed below heater 34. Details of mounting platform 28 will be described below.

A plurality of, for example, three pin insertion holes 37 are installed at the periphery of mounting platform 28 and each pin insertion hole 37 is formed to allow lifter pins 38 to be inserted into and passed through. An elevation arm 40 supports the lower end portion of each of lifter pins 38 and can be lifted or lowered down by an elevation rod 44 which penetrates the bottom of the container air-tightly in cooperation with bellows 42. Lifter pins 38 protruded above mounting platform 28 to push wafer W upward or downward while mounting platform 28 is being lowered down to a mounting position of wafer W.

At a position where wafer W is lowered down, an opening 46 through which wafer W is carried in and out by a transfer arm (not illustrated) is formed and a gate valve 48 to open and close opening 46 is installed, at a side wall of the processing chamber corresponding to a horizontal level of the upper surface of mounting platform 28.

The heaters 49A and 49B are installed at the side wall or the ceiling part of processing container 22 and the source gas is prevented from being solidified or liquefied by maintaining the side wall and the ceiling part at a predetermined temperature.

Mounting platform 28 as illustrated in FIGS. 3 and 4 is primarily constituted with a mounting platform main body 50 having mounted semiconductor wafer W thereon, a base 52 supporting mounting platform main body 50 while surrounding a side surface and bottom surface of mounting platform main body 50. Heater 34 is installed within mounting platform main body 50 and refrigerant path 36 is installed within base 52. Base 52 is adapted to allow the refrigerant to flow in refrigerant passage 36 to maintain the mounting platform main body in a range of temperature lower than that of the decomposition temperature of the source gas and equal to or higher than the solidification temperature or liquefaction temperature. Pin insertion hole 37 or lifter pin 38 is omitted in FIG. 3.

Mounting platform main body 50 is made entirely of a ceramic material or metal and formed in a circular plate shape. Heater 34 is buried with being electrically insulated and approximately throughout the surface inside mounting platform main body 50, so that the temperature of semiconductor wafer W directly mounted on and contacted with the upper surface of mounting platform main body 50 is controlled by heating semiconductor wafer W to a desired temperature.

As materials constituting mounting platform main body 50, ceramic materials, such as, Aluminium nitride (AlN), Aluminium oxide ($Al_2O_3$), and Silicon carbide (SiC), and metal, such as, aluminium and aluminium alloy may be utilized. The diameter of mounting platform main body 50 is set to slightly smaller than that of semiconductor wafer W. For example, when a diameter of semiconductor wafer W is 300 mm, the diameter of mounting platform main body 50 is set to approximately 295 mm. A step portion 54 of which cross section is cut out in a right-angle shape is formed in a ring shape along the circumferential direction of mounting platform main body 50 in the peripheral edge thereof.

Base 52 is made entirely of metal. Base 52 is constituted with a base part 56 made of metal in a circular-plate shape in which refrigerant passage 36 is installed approximately throughout the entire inside surface thereof, and an edge ring 58 made of metal in a ring shape and installed to surround the circumferential surface of mounting platform main body 50 at the peripheral edge of base part 56. For example, cooling water, Fluorinert and Galden (registered trademarks) serving as refrigerant are allowed to flow in refrigerant passage 36 through a pipe (not illustrated).

A ring-shaped thermal conduction relaxation member 60 made of metal having a low thermal conductivity is intervened between base part 56 and edge ring 58. Specifically, base part 52 and edge ring 58 are made of aluminium and aluminium alloy, and ring-shaped thermal conduction relaxation member 60 is made of stainless steel having a lower thermal conductivity than that of aluminium or aluminium alloy. Ring-shaped thermal conduction relaxation member 60 may be installed as needed, otherwise omitted. Base part 56 and edge ring 58 may be made of stainless steel, in spite of having a lower thermal conductivity, instead of aluminium or aluminium alloy. Edge ring 58, ring-shaped thermal conduction relaxation member 60 and base part 56 are integrally connected with each other to be detachable (decomposable) by a plurality of bolts 62 from above.

A thermal insulation material 64 has been intervened between the upper surface of base part 56 and the bottom (lower surface) of mounting platform main body 50 to thermally isolate base part 56 and mounting platform main body 50 from each other. The thermal insulation material 64 may be made of ceramic materials or stainless steel having a low conductivity as well as an excellent heat resistance.

Edge ring 58 includes a ring-shaped flange part 66 extending outwardly in a radial direction of semiconductor wafer W by a predetermined length while maintaining the same level as a horizontal level of a surface on which semiconductor wafer W is mounted. A projecting portion 66a protruding upwardly is formed circumferentially at the peripheral edge of flange part 66.

A protrusion 68 protruding toward mounting platform main body 50 is formed in a ring shape along the circumferential direction of edge ring 58 at the upper portion of the inner peripheral side of edge ring 58, and protrusion 68 extends to the middle of step portion 54 of mounting platform main body 50. Protrusion 68 is provided with a fixing screw 70 penetrating downwardly and fixing screw 70 is screwed downwardly to press the neighboring components of mounting platform main body 50 to fix protrusion 68. Therefore, the inner circumferential surface of edge ring 58 and the outer circumferential surface of mounting platform main body 50 are not directly contacted with each other, a space part 72 for thermally insulating is formed between edge ring 58 and the outer circumferential surface of mounting platform main body 50. Fixing screws 70 are provided, for example, a total of six units, and increase the thermal insulation between edge ring 58 and mounting platform main body 50.

A ring-shaped shield ring 74 is detachably installed between a side surface of step portion 54 of mounting platform main body 50 and the inner circumferential surface of protrusion 68 of edge ring 58 in a loosely fitted state. Ring-shaped shield ring 74 is made of metal such as aluminium and aluminium alloy, and has the functions of preventing of film deposition on the sidewalls of mounting platform main body 50, securing the in-plane temperature uniformity of semiconductor wafer W, preventing the film deposition on the rear surface of semiconductor wafer W, and a thermal insulation between edge ring 58 and mounting platform main body 50.

A ring-shaped cover ring 76 for preventing a film from being adhered to the bevel part corresponding to a cross-section of semiconductor wafer W is installed at the upper surface of the edge ring 58. Cover ring 76 is made of ceramic material, such as for example, alumina or aluminium nitride. Similar to base 52, a temperature of cover ring 76 is also maintained to be lower than the decomposition temperature of the source gas and equal to or higher than the solidification temperature or liquefaction temperature during the film deposition.

A gas introduction mechanism 80 is communicated with a gas inlet 78 installed at the central portion of the ceiling part of processing container 22, and installed to oppose mounting platform 28. Therefore, the source gas is discharged and ejected toward an area further outside than the outer peripheral end of semiconductor wafer W on mounting platform 28 from above in the vertical direction of mounting platform 28. Therefore, gas introduction mechanism 80 supplies the source gas to the exterior portion of semiconductor wafer W mounted on mounting platform 28 in a direction where the source gas is avoided from being supplied.

Specifically, gas introduction mechanism 80 includes a baffle plate 82 having a diameter larger than that of semiconductor wafer W, and baffle plate 82 is supported to be spaced apart by an appropriate distance by the a circular type ring-shaped support member 84 extending downwardly from inner surface of the ceiling part of processing container 22. Therefore, baffle plate 82 is attached to be opposed to semiconductor wafer W on mounting platform 28.

Peripheral edge of the baffle plate 82 as illustrated in FIG. 2 is provided with a plurality of gas discharge ports 86 formed in an arc shape along the circumferential direction of baffle plate 82. The plurality of gas exhaust ports 86 are formed at above the area further outside than the peripheral end of semiconductor wafer W on mounting platform 28 in the vertical direction thereof. A portion between the ceiling part of processing container 22 and baffle plate 82 is formed as a diffusion chamber 88 in which the source gas is diffused, and the source gas diffused outwardly from the diffusion chamber 88 is discharged or injected toward processing space S formed below from the plurality of gas discharge ports 86.

As described above, since a place right under gas discharge ports 86 corresponds to the area further outside than the peripheral end of semiconductor wafer W, the source gas is discharged toward the outer area of semiconductor wafer W, so that the source gas is not allowed to directly flow on the upper surface of semiconductor wafer W.

A plurality of gas injection ports having a smaller inner diameter may be formed along the circumferential direction instead of the arc shaped gas discharge ports 86.

Support member 84 or baffle plate 82 is made of a metal material, such as for example, aluminium or aluminium alloy, having an excellent thermal conductivity.

A ring-shaped internal partition wall 90 extends downwardly from support member 84 to be installed at the lower part thereof. Internal partition wall 90 is integrally formed with support member 84 to be in continuous therewith, and made of the same material as the support member 84. Internal partition wall 90 is installed to surround processing space S above mounting platform 28 and the lower end portion of internal partition wall 90 is provided closely to mounting platform 28. A gas outlet 92 for exhausting is formed in a circular shape along the circumferential direction of mounting platform 28 between the lower end portion of internal partition wall 90 and the peripheral edge of mounting platform 28. An atmosphere inside processing space S is uniformly exhausted from the outer peripheral side of wafer W.

Internal partition wall 90 is positioned above cover ring 76 and flange part 66 positioned at the peripheral edge of mounting platform 28, gas outlet 92 is formed between the top surface of cover ring 76 (including the top surface of flange part 66) and the lower end surface of internal partitioning wall 90. A protrusion 94 formed in a ring shape is formed at a position corresponding to projecting portion 66a of flange part 66 along the circumferential direction of internal partitioning wall 90 in the lower end portion thereof to further narrow the flow width of outer peripheral side 92. The width L1 of gas outlet 92 in the vertical direction is set in a range of 2 mm to 19.5 mm, for example, set to about 5 mm (see FIG. 4).

An orifice forming member 96 is installed at the lower end portion of internal partitioning wall 90. Specifically, orifice forming member 96 is installed at the lower end portion of internal partitioning wall 90 to be extended more inwardly toward the radial direction of mounting platform 28 than internal partitioning wall 90, and is formed in a ring shape along the circumferential direction of mounting platform 28. An orifice 98 communicating with gas outlet 92 is formed between the bottom surface of orifice forming member 96 and the peripheral edge of mounting platform 28. Therefore, orifice 98 is formed to be partitioned between the bottom surface of orifice forming member 96 and the top surface of cover ring 76 disposed at the peripheral edge of mounting platform 28, and formed in a ring shape along the circumferential direction of mounting platform 28.

The material of orifice forming member 96 is made of the material as in internal partitioning wall 90, such as for example, aluminium or aluminium alloy, having an excellent thermal conductivity, and herein, orifice forming member 96 and internal partitioning wall 90 are integrally formed with each other. As described above, orifice forming member 96 is installed to extend in the central direction of processing container 22 to make a portion of the source gas flown down from above to flow toward the central direction of processing container 22. In addition, an area of the flow path of an atmosphere exhausted by orifice 98 is made narrower to appropriately lengthen a staying time of the source gas in processing space S.

In this case, the inner peripheral end of orifice forming member 96 is set to a position located between a place above the outer peripheral end of semiconductor wafer W mounted on mounting platform 28 and a position more spaced apart than the place by 10 mm outwardly in a radial direction of mounting platform 28. Specifically, in FIG. 4, a distance L2 (a distance when viewed from the vertical direction) in the horizontal direction between the outer peripheral end of semiconductor wafer W and the inner peripheral end of orifice forming member 96 is set to be in a range between 0 (zero) mm to 10 mm. When the inner peripheral end of orifice forming member 96 is lengthened to be located over wafer W, the in-plane uniformity of the film thickness is undesirably reduced. Further, if the length L2 becomes larger than 10 mm, the installation effect of orifice 98 is reduced so that the deposition rate is decreased. The width of orifice 98 in the vertical direction L3 (see FIG. 4) is set to be in a range of 2 mm to 19.5 mm, for example, 5 mm, which is the same as the width L1 of gas outlet 92.

The diameter D (see FIG. 1) of the central portion of baffle plate 82 which does not form gas discharge port 86 of baffle plate 82 has a magnitude equal to or higher than that of wafer W. For example, when a wafer W having a diameter of 300 mm is subjected to the deposition processing, the diameter D of 300 mm or more is required. The distance G between baffle plate 82 and wafer W is set to be in a range of, for example, 25 mm to 67 mm.

Mounting platform 28 is disposed on a location as illustrated in FIG. 4 when being subjected to the deposition processing, but lowered down as illustrated in FIG. 5 when being subjected to other processings, such as for example, carrying in and out of semiconductor wafer W.

The control of overall operations of the deposition device, such as for example, starting and stopping of gas supply, and the control of process temperature, process pressure, and temperature of the refrigerant flowing in refrigerant passage 36, may be performed by a device control unit 100 constituted by, for example, a computer.

A computer-readable program necessary for controlling the deposition processing in deposition device 20 is stored in a storage medium 102, and a flexible disk, Compact Disk (CD), CD-ROM, a hard disk, a flash memory or DVD may be used as storage medium 102.

Next, the deposition processing performed by deposition device 20 having a configuration as described above will be described with reference to FIGS. 6A and 6B. FIGS. 6A and 6B are diagrams illustrating the flow of a source gas within processing container 22, FIG. 6B is an enlarged diagram illustrating the surrounding portions of the orifice in FIG. 6A.

First, semiconductor wafer W is transported into processing container 22 to be mounted on mounting platform 28 in deposition device 20. The inside of processing container 22 is maintained at a predetermined pressure by being subjected to a vacuum treatment in accordance with a continuous driving of exhaust system 11. Semiconductor wafer W supported on mounting platform 28 is maintained at a predetermined temperature by heater 34.

The side wall of processing container 22, the ceiling part, support member 84, internal partition wall 90 and orifice forming member 96 are also maintained at a predetermined temperature by heaters 49A and 49B, respectively. The predetermined temperature is in a range lower than the decomposition temperature of raw material and equal to or higher than the solidification temperature or liquefaction temperature, and these elements are heated to, for example, about 80° C., respectively.

The source gas (Ru$_3$(CO)$_{12}$) is supplied by gas supply system 14 together with CO gas serving as a carrier gas under the temperature condition as described above, and the source gas and the carrier gas are introduced into diffusion chamber 88 from the gas inlet 78.

The source gas introduced is diffused toward the periphery of diffusion chamber 88 due to the presence of baffle plate 82 and discharged toward downward from each of gas discharge ports 86 installed at the periphery of baffle plate 82 to flow-down into processing space S as indicated by the arrows 110 (see FIG. 6). The direction of the flowing-down is toward an area outer side of outer peripheral end of wafer W corresponding to the peripheral end of mounting platform 28. A portion of the source gas is diffused toward the central portion of processing space S in the middle of the flowing-down process as indicated by the arrow 112 (see FIG. 6A) and stays therein.

Simultaneously, most of the source gas having been flowed-down comes in contact with orifice forming member 96 installed to be extended toward the central portion of processing space S at the lower end of internal partition wall 90, and deflects toward the central portion of processing space S. A portion of the source gas having been deflected stays in processing space S, while most of the source gas flows inside orifice 98 in which flow path area is made narrower and passes through gas outlet 92 to flow into a space formed at below mounting platform 28 in processing container 22 as indicated by the arrow 115. The atmosphere within processing container 22 passes through exhaust port 26 to be exhausted outside processing container 22. The source gas supplied to semiconductor wafer W in processing space S is thermally decomposed on semiconductor wafer W to form a Ru film by CVD. The reaction of the film deposition at the time of forming the Ru film is represented by the following chemical formula, and carbon monoxide (CO) which is the same gas species as the carrier gas is generated by the reaction.

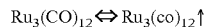

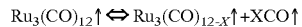

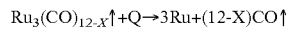

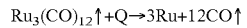

In the chemical formula, the symbol "⇔" represents that the reaction is reversible, "↑" represents that the compound is in a gaseous state, the compound to which the arrow "↑" is not given represents that it is in a solid state, and the "Q" represents a state in which a heat is being applied during the reaction.

As described above, since orifice 98 of which flow path area is appropriately made narrower is installed, the source gas is stayed within processing space S for a suitable time, and further, the amount of source gas residing in the central portion of processing space S does not become excessive, and the atmosphere in processing space S is discharged through orifice 98 and gas outlet 92. That is, a concentration of the source gas residing in the central portion of processing space S always maintained to be lower than that resides in the periphery thereof, and the source gas contained in processing space S is allowed to be stayed appropriately while maintaining such concentration conditions as described above.

Figure 7:
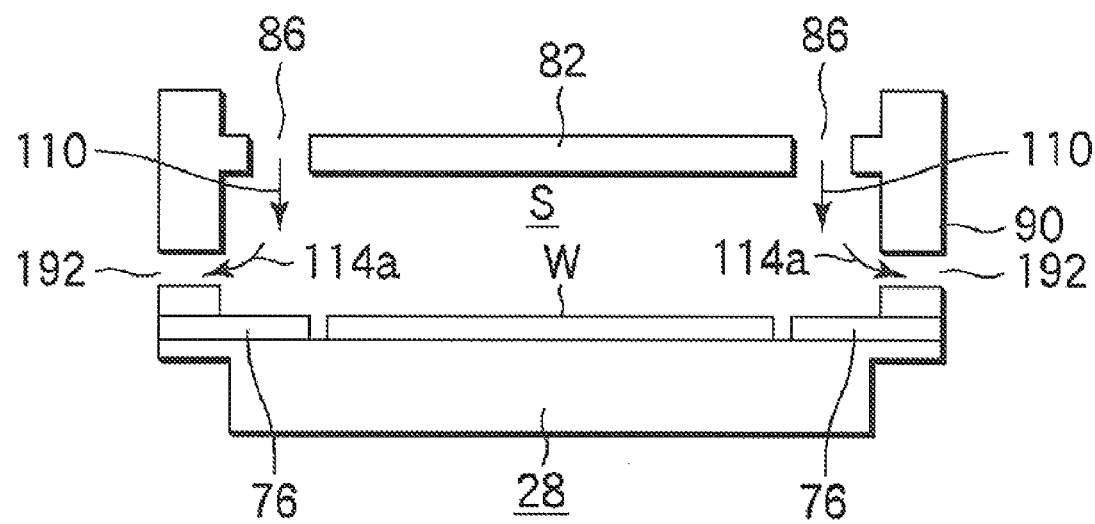
FIG. 7 is a diagram illustrating a flow of a source gas within a processing container in the deposition device, according to the related art.

That is, in a configuration of the Patent Document 3 in which a gas outlet 192 is simply installed between internal partition wall 90 and mounting platform 28 without installing the orifice as illustrated in FIG. 7, the source gas flowed-down from gas discharge port 86 as indicated by the arrow 110 is discharged from gas outlet 192 as it is as indicated by the arrow 114a. Therefore, an amount of the source gas contributing to the film deposition becomes small so that the deposition rate tends to be low. However, in the first embodiment, since the staying time of the source gas within processing space S can be extended appropriately due to the presence of the orifice 98 in which flow rate area is appropriately made narrower, it is possible to increase the deposition rate of the Ru film without damaging the in-plane uniformity of film thickness. Therefore, in the embodiment, it is possible to deposit Ru film at a higher film deposition rate than the related art while maintaining the high in-plane uniformity of film thickness.

In this case, the process conditions are as follows: the process pressure is in a range of 0.001 Torr to 1 Torr, for example, 0.1 Torr; wafer W temperature is equal to or higher than the decomposition temperature of the source gas, for example, in a range of 150° C. to 250° C., for example, about 190° C. The flow rate of the source gas is 1 sccm to 2 sccm and the flow rate of CO gas as the carrier gas is 100 sccm. The temperatures of orifice forming member 96, internal partition wall 90 and cover ring 76 at the peripheral edge of mounting platform 28 are set to be lower than the decomposition temperature of raw material and equal to or higher than the solidification temperature or liquefaction temperature, for example, 80° C. Therefore, an unnecessary film is not deposited on the surfaces of those constitutional members.

As described above, the first aspect of the present invention provides a deposition device for forming a thin film on semiconductor wafer W which is a workpiece, using a source gas including an organometallic compound, the deposition device including: processing container 22 which is exhaustible and in which semiconductor wafer W which is a workpiece is accommodated; mounting platform 28 having mounted semiconductor wafer W thereon and installed with heater 34 for heating semiconductor wafer W; gas introduction mechanism 80 disposed above mounting platform 28 to be opposed thereto and configured to introduce the source gas toward the area further outside than the outer peripheral end of semiconductor wafer W on mounting platform 28; internal partition wall 90 which surrounds processing space S above mounting platform 28 to form a boundary for processing space S and installed such that the lower end portion of the internal partition wall comes close to mounting platform 28 to form gas outlet 92 between the lower end portion of the internal partition wall and the peripheral edges of mounting platform 28; and orifice forming member 96 installed on the lower end of internal partition wall 96 to extend radially inward toward mounting platform 28 to form orifice 98 communicating with gas outlet 92 between the internal partition wall and the peripheral edge of mounting platform 28. Therefore, it is possible to increase the deposition rate while maintaining a high in-plane uniformity of the film thickness.

Deposition Device According to Second Embodiment

Figure 8:
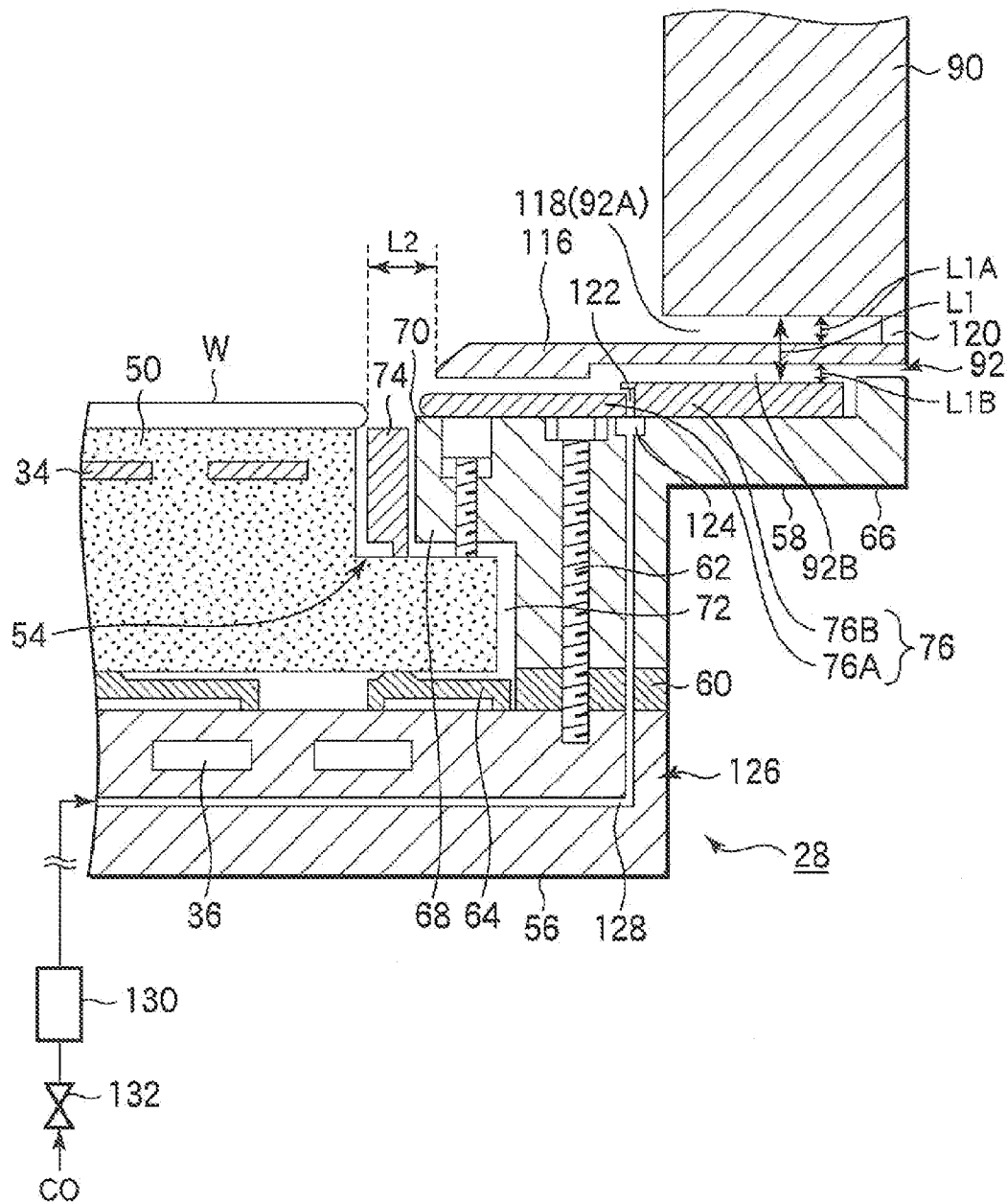
FIG. 8 is a partially enlarged cross-sectional view illustrating a portion of a mounting platform in a deposition device, according to a second embodiment of the present invention.
Figure 9:
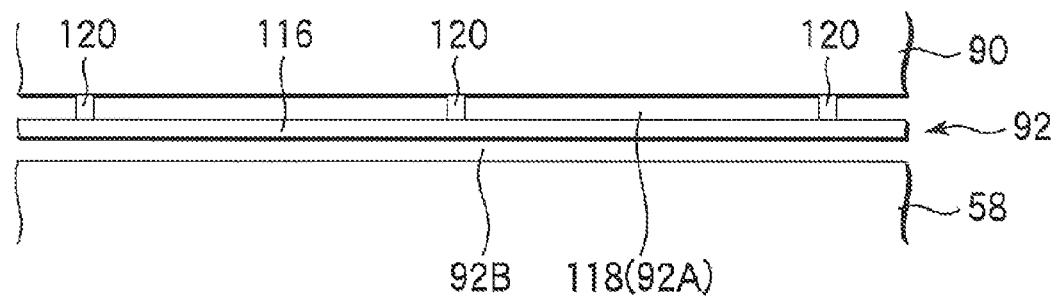
FIG. 9 is a side view illustrating the portion of the mounting platform in the deposition device, according to the second embodiment of the present invention.

A deposition device according to a second embodiment of the present disclosure will be described. FIG. 8 is a partially enlarged cross-sectional view illustrating a portion of the deposition device according to the second embodiment of the present invention, and FIG. 9 is a side view illustrating the portion of the mounting platform in the deposition device of the FIG. 8. In addition, the portions not illustrated in FIGS. 8 and 9 have the same configuration as that of the first embodiment. FIG. 8 corresponds to FIG. 4 in the first embodiment, and the same reference numerals are given to the same constitutional elements as those illustrated in FIG. 4, and description thereof will be omitted.

In the above-described first embodiment, orifice forming member 96 is formed to be integral with internal partition wall 90. However, in the second embodiment, an orifice forming member 116 formed to be thinner than orifice forming member 96 of the first embodiment, and molded in a thin plate-type circular ring shape in which the width in the radial direction is set to be larger than that of the first embodiment is provided. The thickness of the orifice forming member 116 having a thin plate-type circular ring shape is set to smaller than a width L1 of gas outlet 92. Orifice forming member 116 is installed to be inserted into gas outlet 92 between internal partition wall 90 and mounting platform 28, and an upper gap 92A and a lower gap 92B are formed at above and below orifice forming member 116, respectively. Upper gap 92A is adapted to serve as an orifice 118 which is formed in a ring shape along the circumferential direction of mounting platform 28 as in orifice forming member 98 in the first embodiment.

Similar to the first embodiment, an inner peripheral end of orifice forming member 116 is installed to be extended inwardly toward mounting platform 28. The outer peripheral end of orifice forming member 116 is supported in a state of being suspended by a plurality of support arms 120 disposed to be spaced apart at a predetermined interval along the circumferential direction of internal partition wall 90 at the lower end portion thereof (see FIG. 9).

A total of, for example, about 6 (six) support arms 120 are simply installed having almost no effect on the exhausting of gas. Support arms 120 are also made of material such as aluminium or aluminium alloy, having an excellent thermal transmitivity similar to orifice forming member 116, and set to a temperature, for example, about 80° C., lower than the decomposition temperature of the source gas and equal to or higher than the solidification temperature or liquefaction in the first embodiment so that a thin film is not adhered on the surface of support arms 120. Protrusion 94 installed at gas outlet 92 in the first embodiment is not installed in the second embodiment.

Both the width L1A of upper gap 92A and width L1B of lower gap 92A in vertical direction are about 1 mm to 5 mm, respectively. The distance L2 (a distance when viewed from the vertical direction) between the inner peripheral end of orifice forming member 116 and outer peripheral end of wafer W in the horizontal direction is set to be in a range of 0 mm to 10 mm as in the first embodiment. The reason of such a setting for the distance L2 is the same as in the first embodiment.

Herein, cover ring 76 installed on edge ring 58 is divided into an inner side ring 76A and outer side ring 76B, and a minute gap is formed between both side rings 76A and 76B. A purge gas supply mechanism 126 is installed to supply a gas, serving as a purge gas which is the same kind as that of the carrier gas, to lower gap 92B through a gap 122. Specifically, purge gas supply mechanism 126 has a gas groove 124 formed in a ring shape along the circumferential direction of edge ring 58 at edge ring 58 corresponding to gap 122. Gas groove 124 is connected to a gas flow path 128 formed to pass through post 30 and mounting platform 28. Specifically, gas flow path 128 is adapted to extend into post 30 vertically, into base part 56 of base 52 in mounting platform 28 horizontally, and into edge ring 58 vertically to reach gas groove 124. A flow rate controller 13, such as mass flow controller or an opening and closing valve 132, is intervened in gas flow path 128, and adapted to supply CO gas as the purge gas while controlling CO gas flow rate as needed.

Figure 10:
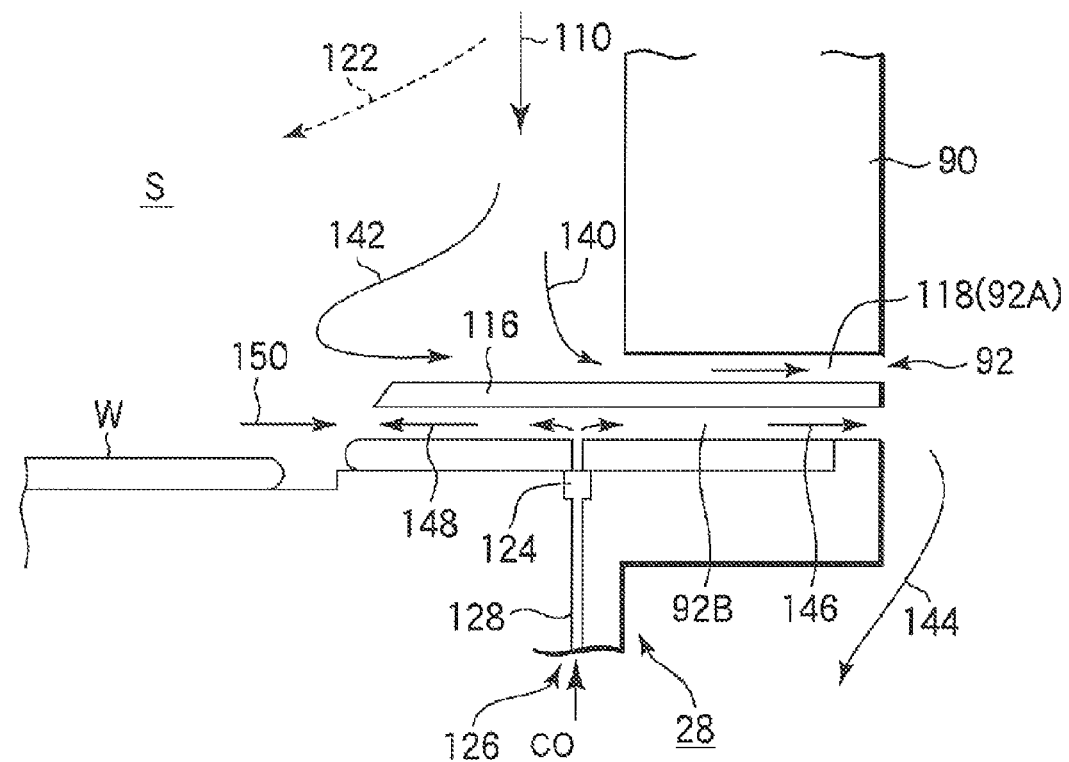
FIG. 10 is a diagram illustrating a flow of a source gas within the processing container of the deposition device, according to the second embodiment of the present invention.

FIG. 10 is a diagram illustrating the flow of a source gas within a processing container in the deposition device of the second embodiment, and corresponds to FIGS. 6A and 6B in the first embodiment. In the second embodiment, a portion of the source gas having been flowed-down from gas discharge port 86 (see FIG. 1) of baffle plate 82 in the vertical direction as indicated by the arrow 110 is diffused toward the central portion of mounting platform 28 to stay in the processing container as indicated by the arrow 122 as in the first embodiment. A flow path area of a portion of the source gas having been flowed-down further in the vertical direction is made narrower at the orifice 118 corresponding to upper gap 92A of gas outlet 92 to be discharged as indicated by the arrow 140.

Further, the other portion of the source gas being floweddown comes in contact with an upper surface of the peripheral edge inside orifice forming member 116 and thus temporarily flows towards the central portion of mounting platform 28 and then returns therefrom to be flown-out through orifice 118. By doing this, the source gas contained in processing space S temporarily stays therein and simultaneously flows in orifice 118 whose flow path area is made narrower to be flown-out toward below mounting platform 28 as indicated by the arrow 144.

As described above, since orifice 98 of which flow path area is appropriately made narrower is installed, the source gas stays within processing space S for a suitable time, and further, the amount of source gas residing in the central portion of processing space S does not become excessive, and the atmosphere in processing space S is discharged through orifice 118 and gas outlet 92. That is, the concentration of the source gas residing in the central portion of processing space S always maintained to be lower than that residing in the periphery thereof, and the source gas contained in processing space S is allowed to be stayed appropriately while maintaining such concentration conditions as described above. As a result, as in the first embodiment, it is possible to deposit Ru film at a high deposition rate while maintaining a high in-plane uniformity of the film thickness.

In the second embodiment, when a film deposition is conducted as described above, the purge gas of which flow rate is controlled is supplied into flow path 128 of purge gas supply mechanism 126. The purge gas is flowed into lower gap 92B installed below orifice forming member 116 from gas groove 124 formed in a ring shape. A portion of the purge gas flowed into lower gap 92B is sucked-in to be flown toward outward as indicated by the arrow 146. The remaining purge gas flows toward processing space S as indicated by the arrow 148, but in this case, interferes with the flow of the source gas intending to flow into lower gap 92B to be collided therewith, so that it is possible to prevent the source gas from being flown into lower gap 92B.

Therefore, it is possible to prevent an unnecessary film from being deposited on a surface of the peripheral edge of mounting platform 28, specifically, the surfaces of cover ring 76 and edge ring 58. In addition, since CO gas which is the same kind as the carrier gas is utilized as the purge gas and the CO gas acts to suppress the decomposition of the source gas, it is possible to further improve the prevention of the unnecessary film deposition. In this case, when the larger amount of CO gas is flown into processing space S than lower gap 92B to reach the peripheral edge of semiconductor wafer W, the film deposition at the top surface of the peripheral edge of semiconductor wafer W is deteriorated, and thus, it is undesirable. Therefore, it is preferable that the flow rate of the CO gas is set to be very small and the flow rate of the purge gas as indicated by the arrow 148 is preferably set to an order of an amount not being allowed to escape toward processing space S.

As described above, the second aspect of the present invention provides a deposition device for forming a thin film on a semiconductor wafer W which is a workpiece using a source gas including an organometallic compound, the deposition device including: processing container 22 which is vacuum exhaustible in which semiconductor wafer W which is a workpiece is accommodated; mounting platform 28 having mounted semiconductor wafer W thereon and installed with heater 34 for heating semiconductor wafer W; gas introduction mechanism 80 disposed above mounting platform 28 to be opposed thereto and configured to introduce the source gas toward the area further outside than the outer peripheral end of semiconductor wafer W on mounting platform 28; internal partition wall 90 configured to surround processing space S above mounting platform 28 to form a boundary for processing space S and installed such that the lower end portion of the internal partition wall comes close to mounting platform 28 to form gas outlet 92 between the lower end portion of the internal partition wall and the peripheral edges of mounting platform 28; and orifice forming member 116 intervened to form upper gap 92A and a lower gap 92B in gas outlet 92, the inner peripheral end is disposed to extend radially inward toward mounting platform 28, and upper gap 92A forms orifice 98. Therefore, it is possible to increase the deposition rate while maintaining a high in-plane uniformity of the film thickness. Furthermore, since the purge gas is allowed to flow in lower gap 92B, it is possible to suppress the deposition of the film on the peripheral edge of mounting platform 28. As a result, a higher deposition rate can be achieved than the first embodiment.

Evaluation of Experiment of First Embodiment and Second Embodiment

The results obtained by conducting the evaluation of experiment for the deposition devices of the first and second embodiments will be described. Further, for comparison purposes, an experiment was conducted for a conventional deposition device having no orifice (see FIG. 7).

In the conventional deposition device, the width of gas outlet 192 (see FIG. 7) of the lower end of internal partition wall 90 in the vertical direction was set to 2 mm. In the deposition device of the first embodiment, both the width L1 of gas outlet 92 and the width L3 of orifice 98 in the vertical direction were set to 2 mm, and the distance L2 was set to 10 mm (see FIG. 4). Further, in the deposition device of the second embodiment, the width L1A of orifice 118 (upper gap 92A) in the vertical direction was set to 3 mm, the width L1B of lower gap 92B was set to 2 mm, and the distance L2 was set to 8 mm (see FIG. 8). In addition, the flow rate of the CO gas of the purge gas supply mechanism 126 was set to 100 sccm. All other process conditions are set to be the same to deposit Ru film.

Figure 11:
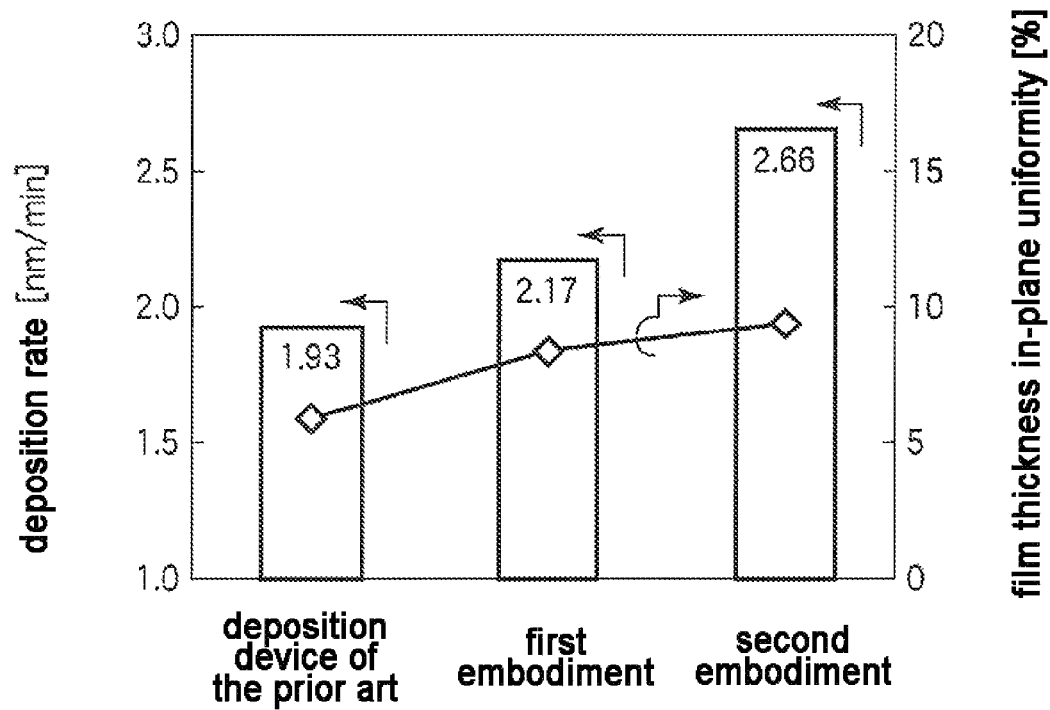
FIG. 11 is a graph illustrating a relationship between the deposition rates and the in-plane uniformities in the deposition devices, according to the first and second embodiments of the present invention and the related art.

The results under the above-described conditions are represented in FIG. 11. FIG. 11 is a graph illustrating a relationship between the deposition rate and in-plane uniformity in the deposition devices according to the first and second embodiments of the present invention and the related art. As illustrated in FIG. 11, the deposition rate of the related art was 1.93 nm/min, while those of the first embodiment and second embodiment are 2.17 nm/min and 2.66 nm/min, respectively. Accordingly, it was confirmed that higher deposition rates than that obtained in the related art can be obtained in the first and second embodiments. Specifically, it was confirmed that the deposition rates can be significantly improved by the deposition device in the second embodiment.

The in-plane uniformity according to the related art was about 6%. In contrast, it was confirmed that although the uniformities of the thicknesses in the first and second embodiments was decreased, both of the uniformities of the thicknesses were within an allowable range, which is a limit value of 10% or less.

Deposition Device According to Third Embodiment

Figure 12:
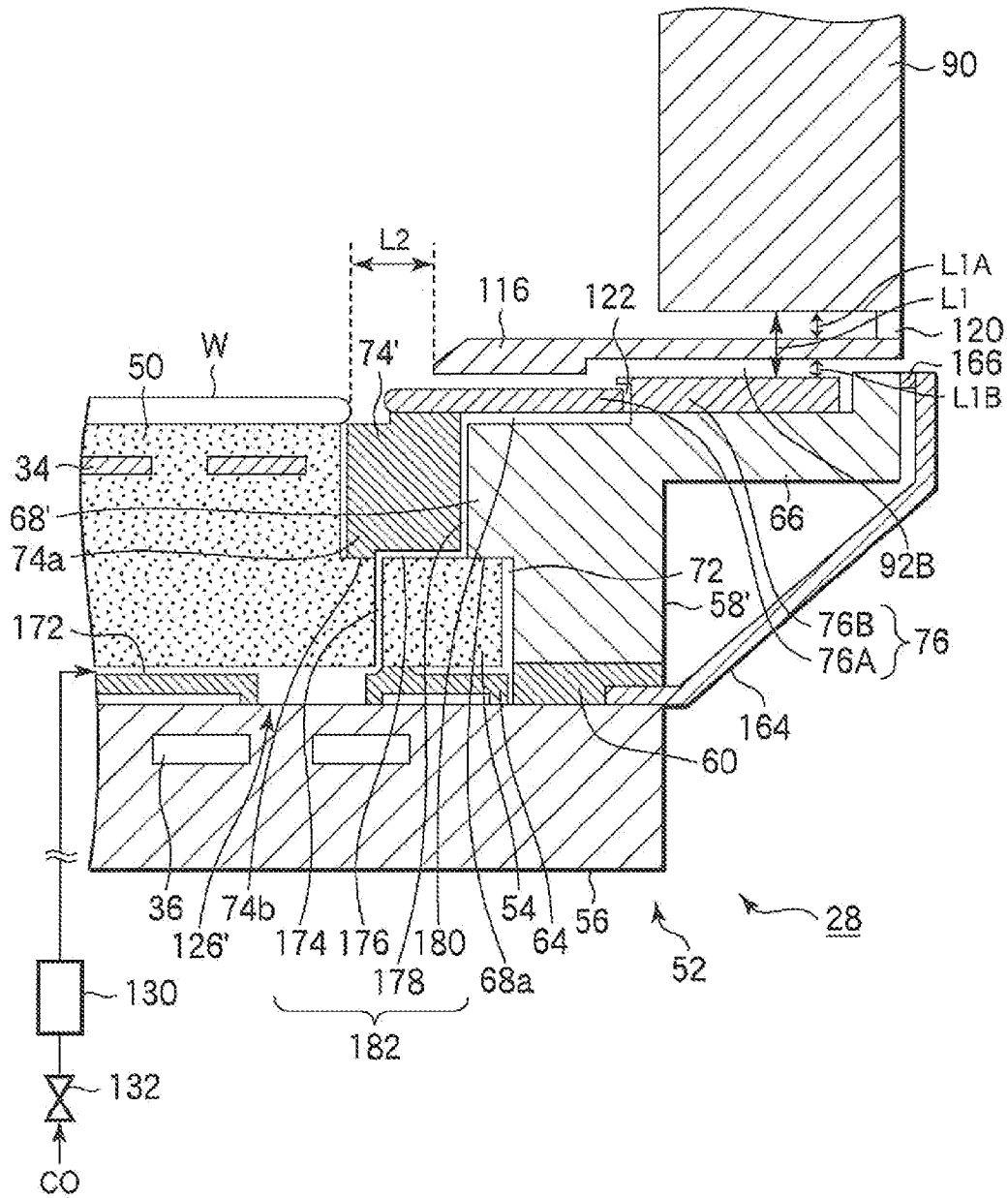
FIG. 12 is a partially enlarged cross-sectional view illustrating a portion of a mounting platform in a deposition device, according to a third embodiment of the present invention.

Next, a deposition device according to a third embodiment of the present invention will be described. FIG. 12 is a partially enlarged cross-sectional view illustrating a portion of the deposition device according to a third embodiment of the present invention. In addition, the portions not illustrated in FIG. 12 have the same configuration as that of the first embodiment. The configuration illustrated in FIG. 12 corresponds to that illustrated in FIG. 8 of the second embodiment, and the same reference numerals are given to the same constitutional elements as those illustrated in FIG. 8, and description thereof will be omitted.

In the second embodiment, edge ring 58 and shield ring 74 of mounting platform 28 are installed to be thermally isolated from mounting platform main body 50, and the temperatures of edge ring 58 and shield ring 74 are maintained at a temperature of, for example, 80° C., lower than the decomposition temperature of the source gas and equal to or higher than the solidification temperature or liquefaction temperature and the purge gas is allowed to flow in lower gap 92B to prevent the deposition of an unnecessary film on edge ring 58, cover ring 76 and shield ring 74 of the peripheral edge of mounting platform 28. However, in this configuration, since the temperature of the peripheral edge of the mounting platform 28 is lower than a film deposition temperature, and also, the purge gas having a temperature lower than the film deposition temperature reaches the peripheral edge of semiconductor wafer W, an in-plane uniformity of the thickness obtained according to the second embodiment has a limitation.

Therefore, the third embodiment is configured such that the film deposition on the peripheral edge of mounting platform 28 can be prevented, and the in-plane uniformity of the thickness can be further improved as well.

In the third embodiment, a peripheral ring member is constituted by a shield ring 74' and an edge ring 58'. Specifically, instead of shield ring 74 of the second embodiment, shield ring 74' having a wider width and being partially contacted to mounting platform main body 50 heated to a deposition temperature is installed, and instead of edge ring 58 of the second embodiment, edge ring 58' being partially contacted to mounting platform main body 50 is installed.

Shield ring 74' is installed so that a minute gap is formed between the inner peripheral surface thereof and the outer peripheral surface of mounting platform main body 50. Further, a contacting protrusion 74a is installed at a portion of mounting platform main body 50 side of the bottom surface of shield ring 74' to be protruded downward and the bottom surface of contacting protrusion 74a is formed as a contacting portion 74b contacting the top surface of step portion 54 of mounting platform main body 50. By doing this, shield ring 74' is heated due to a heat transfer from mounting platform main body 50. Shield ring 74' is made of metal, such as for example, aluminium or aluminium alloy and is temperature-adjusted to become (e.g., lower than 10° C.) nearly equal to or slightly lower than that of semiconductor wafer W according to the above-mentioned configuration. The temperature of shield ring 74' is adjusted by adjusting a contact area of contacting portion 74b of contacting protrusion 74a.

A step portion 68' is formed at an inner upper portion of edge ring 58'. A minute gap is formed between an inner peripheral surface of step portion 68' and the outer peripheral surface of shield ring 74. The bottom surface of step portion 68' contacts the top surface of step portion 54 of mounting platform main body 50 and is formed as a contacting portion 68a. Edge ring 58' is made of metal, such as for example, aluminium or aluminium alloy and is temperature-adjusted to become nearly equal to or slightly lower than that of semiconductor wafer W according to the above-mentioned configuration (e.g., lower than 10° C.). The temperature of edge ring 58' is adjusted by adjusting a contact area of contacting portion 68a of step portion 68'. Edge ring 58', thermal conduction relaxation member 60 and base member 56 are coupled to each other by a plurality of bolts (not illustrated). A gap may be formed between edge ring 58' and base member 56 instead of installing thermal conduction relaxation member 60, and both the gap and thermal conduction relaxation member 60 may be installed.

In addition, shield ring 74' and edge ring 58', instead of being directly contacted to mounting platform main body 50 using contacting portion 74b and contacting portion 68a, may be partially contacted to mounting platform main body 50 through an intervening metal material having an excellent thermal transmitivity, such as for example, a spacer member having a low thermal heat resistance made of, for example, aluminium or copper. The temperatures of shield ring 74' and edge ring 58' may become a predetermined temperature lower than that of mounting platform main body 50 in any way which allowing shield ring 74' and edge ring 58' to be partially contacted to mounting platform main body 50 having a highest temperature.

As a result, the temperatures of shield ring 74' and edge ring 58' become lower than that of mounting platform main body 50. However, when the Ru film is formed with $Ru_3(CO)_{12}$ as a source gas, mounting platform main body 50 is heated to a temperature of about 215° C., semiconductor wafer W is heated to a temperature of about 190° C., and shield ring 74' and edge ring 58' are heated to a temperature of about 180° C. to about 190° C.

In the third embodiment, a cover member 164 including a material, such as aluminium having a high thermal transitivity, is installed to cover the outer peripheral side (a side opposing processing chamber 22) of edge ring 58'. Cover member 164 is installed so that a lower end portion thereof is pressed between thermal conduction relaxation member 60 and base member 56, and an upper end portion thereof is attached to edge ring 58' by allowing an intervening thermal insulation material 166 to be intervened. Cover member 164 is maintained at a temperature, for example, about 80° C., which is close to that of base member 56, lower than the decomposition temperature of the source gas and equal to or higher than the solidification temperature or liquefaction temperature.

In the third embodiment, a purge gas supply mechanism 126' capable of supplying a much higher temperature purge gas is installed instead of purge gas supply mechanism 126 of the second embodiment. Purge gas supply mechanism 126' includes a gas flow path 182 including a flow path (not illustrated) of post 30, a flow path 172 between mounting platform main body 50 and thermal insulation material 64, a flow path 174 connected to flow path 172 to vertically extend in step portion 54 of mounting platform main body 50, a flow path 176 between shield ring 74' and step portion 54, a flow path 178 between shield ring 74' and edge ring 58', and a flow path 180 between edge ring 58' and inner peripheral ring 76A of cover ring 76. Flow path 180 is connected to the gap between inner peripheral ring 76A and outer peripheral ring 76B. Therefore, the purge gas flows in flow path 182 is heated by mounting platform main body 50, shield ring 74' and edge ring 58', and supplied to gap 92B at a temperature equal to or slightly lower than that of semiconductor wafer W, for example, about 170° C.

In addition to forming a gap serving as a gas flow path by dividing cover ring 76 into inner peripheral ring 76A and outer peripheral ring 76B, a temperature gradient is formed by, for example, making those rings with different materials. Cover ring 76 may be divided into 3 (three) parts or more. Inner peripheral ring 76A and outer peripheral ring 76B may be made of ceramics, such as for example, alumina or aluminium nitride, and metal, such as for example, aluminium or aluminium alloy, and may also be made of either the same material or different materials. For example, inner peripheral ring 76A and outer peripheral ring 76B may be made of ceramics and aluminium, respectively. Since cover ring 76 is formed over shield ring 74' and edge ring 58' serving as the peripheral ring, the temperature of cover ring 76 is slightly lower than those of shield ring 74' and edge ring 58', and is lower than that of semiconductor wafer W by 20° C. to 30° C., for example, about 170° C. That is, the surface temperature of the peripheral edge of mounting platform 28 is maintained at a temperature near that of semiconductor wafer W, that is, equal to or lower than that of semiconductor wafer W which is the workpiece. The decomposition temperature of $Ru_3(CO)_{12}$ is 130° C. or more, and cover ring 76 is heated to a temperature equal to or higher than the decomposition temperature of the source gas.

Figure 13:
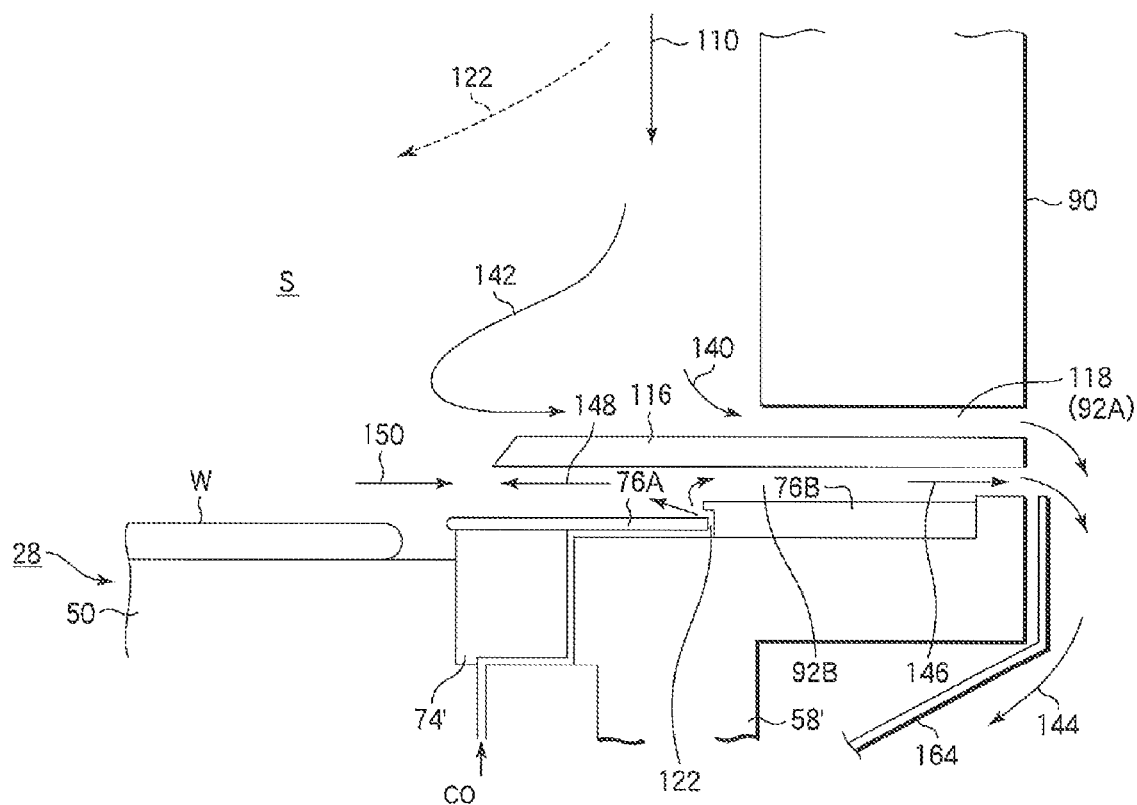
FIG. 13 is a diagram illustrating temperatures of a semiconductor wafer W and each constituents, and flow of the source gas within the processing container of the deposition device, according to the third embodiment of the present invention.

In the third embodiment, as illustrated in FIG. 13, since orifice 118 of which flow path area is appropriately made narrower is installed as in the second embodiment, the source gas flows as illustrated in FIG. 10 and stays within processing space S for a suitable time, and further, the amount of source gas residing in the central portion of processing space S does not become excessive, and the atmosphere in processing space S is discharged through orifice 118 of gas outlet 92. That is, the concentration of the source gas residing in the central portion of processing space S always maintained to be lower than that residing in the periphery thereof, and the source gas contained in processing space S is allowed to stay appropriately while maintaining such concentration conditions as described above. As a result, it is possible to deposit Ru film at a high deposition rate while maintaining a high in-plane uniformity of the film thickness.

Furthermore, shield ring 74' and edge ring 58' constituting the peripheral ring of the peripheral edge of mounting platform 28 is set to a temperature (180° C. to 190° C.) equal to or slightly lower than the temperature (190° C.) of semiconductor wafer W and also the temperature of the purge gas being flown is maintained at a temperature near that of semiconductor wafer W. Therefore, the temperature of the peripheral edge of semiconductor wafer W on mounting platform 28 is maintained at a relatively high, so that it is possible to make in-plane uniformity of the film thickness to be higher than that in the second embodiment.

In the related art, the source gas passes through the peripheral edge of the mounting platform to be discharged, and further the peripheral edge of the mounting platform is heated to a temperature (e.g., 215° C.) equal to that of the central portion on which semiconductor wafer W is mounted, so that the source gas is decomposed at the peripheral edge of the mounting platform to cause a large amount of films to be deposited thereon. However, in the third embodiment, the end portions of edge ring 58' and shield ring 76 are covered by orifice forming member 116 being maintained at a temperature, for example, about 80° C., lower than the decomposition temperature of the source gas. Further, shield ring 74' and edge ring 58' of mounting platform 28 are formed to be partially contacted with mounting platform main body 50 to allow the temperatures of the edge of shield ring 74' and edge ring 58' to be a temperature (180° C. to 190° C.) which is lower than that of the mounting platform main body 50 and equal to or slightly lower than that of semiconductor wafer W. Therefore, the temperature of cover ring 76 located above semiconductor wafer W can be reduced further (e.g., 170° C.). As a result, it is possible to suppress the deposition of the film on the peripheral edge of mounting platform 28.

Furthermore, since a purge gas flows from a gap 122 between inner peripheral ring 76A and outer peripheral ring 76B to a gap 92B between orifice forming member 116 and the surfaces of shield ring 74, cover ring 76 and edge ring 58 corresponding to the peripheral edge of mounting platform 28, an unnecessary deposition of the film on those surfaces can be further suppressed. In this case, since the temperature of the purge gas is about 170° C., even when the flow rate is somewhat increased, the variation of the film thickness can be maintained at a low degree. Accordingly, it is possible to effectively prevent the unnecessary deposition of film by increasing the flow rate of the purge gas.

In addition, since the outer peripheral side of edge ring 58' is covered by over member 164 maintained at a temperature of, for example, about 80° C., which is lower than that of the source gas, the deposition of film on the covered outer peripheral side is also suppressed.

As described above, in the third embodiment, in addition to further improve the in-plane uniformity of the film thickness, an unnecessary deposition of film on the peripheral edge of mounting platform 28 can be suppressed. Further, since the unnecessary adhesion of film on the peripheral edge of mounting platform 28 can be suppressed, it is possible to discharge the source gas that does not contribute to the reaction on semiconductor wafer W at a high ratio in a non-reacted state. Therefore, it is possible to recover the expensive source gas of $Ru_3(CO)_{12}$ in a high recovery rate.

In case of depositing the Ru film, the temperature of semiconductor wafer W is preferably 150° C. to 250° C., and the temperature of orifice forming member 116 and cover member 164 is preferably has a temperature of 50° C. to 120° C. at which the raw material is not decomposed, solidified and liquefied. Also the temperature of cover ring 76 is preferably lower than that of semiconductor wafer W by 20° C. to 30° C.

Evaluation of Experiment of Third Embodiment

Figure 14:
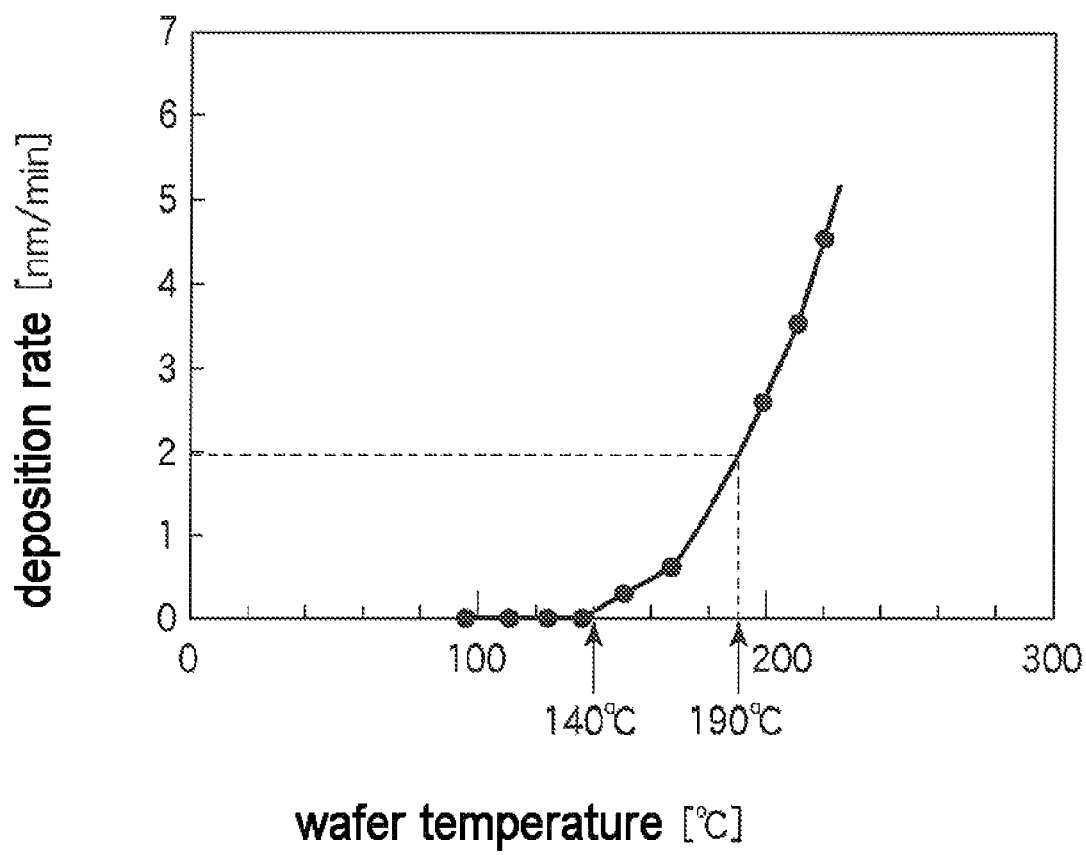
FIG. 14 is a graph illustrating a relationship between the deposition rate and in-plane uniformity in the deposition devices, according to the first and second embodiments of the present invention and the related art.

Relationship Between the Semiconductor Wafer Temperature and the Deposition Rate In the third embodiment, results obtained from the investigation of the relationship between the temperature of the wafer and the deposition rate when $Ru_3(CO)_{12}$ is actually used as the raw material will be described. FIG. 14 is a graph illustrating a relationship between the temperature of the wafer and the deposition rate when $Ru_3(CO)_{12}$ is used as the raw material. Herein, CO gas is used as the carrier gas and the flow rate of the CO gas is set to 100 sccm. As illustrated in FIG. 14, the film is not deposited when the wafer temperature is lower than 140° C., and the film deposition starts when the wafer temperature is about 140° C. The deposition rate increases rapidly with increasing the temperature. It may be understood that the wafer temperature of 175° C. or more is required for obtaining the deposition rate of 1 nm/min or more, and the wafer temperature of 190° C. or more is required for obtaining the deposition rate of 2 nm/min or more.

Figure 15:
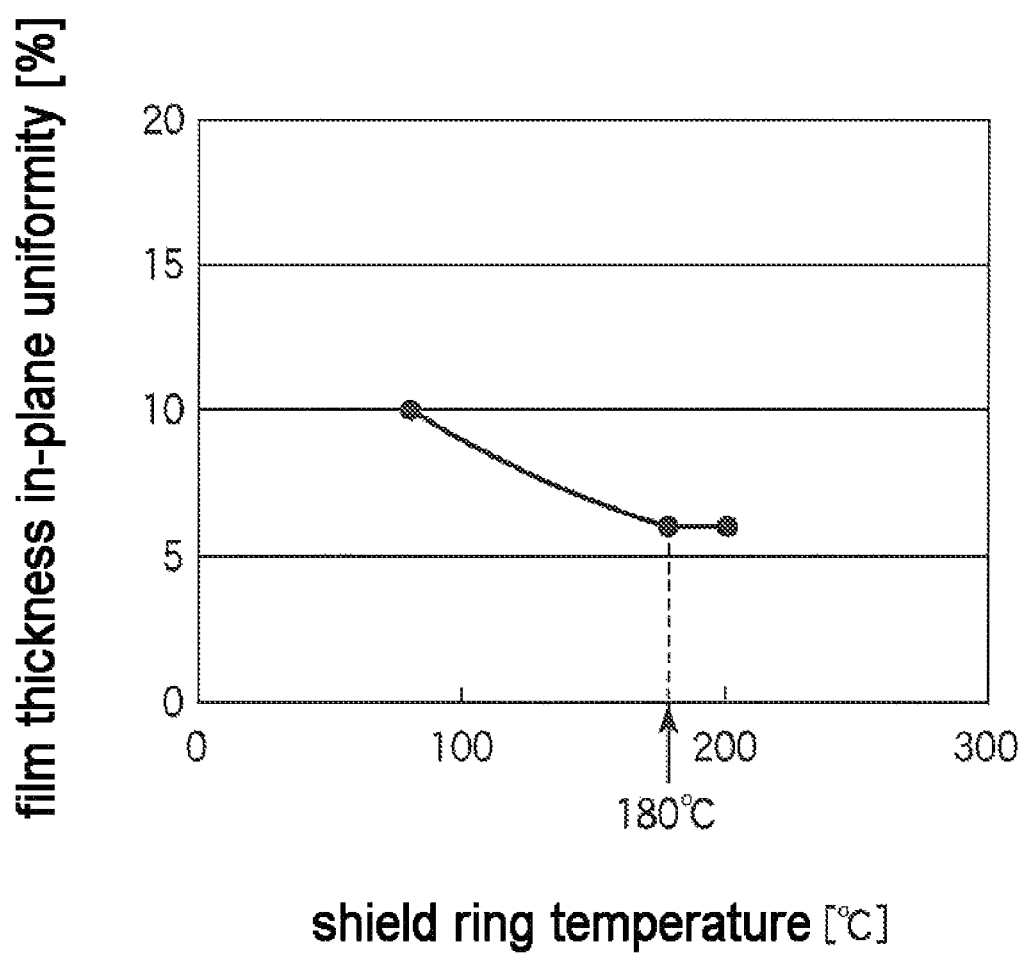
FIG. 15 is a graph illustrating a relationship between a temperature of a shield ring and in-plane uniformity of film thickness.

Relationship Between Temperature of Shield Ring as a Peripheral Component of Main Body of Mounting Platform and in-Plane Uniformity of Film Thickness Next, the results obtained from the investigation of the relationship between the temperature of the shield ring of a peripheral component of the mounting platform main body and the in-plane uniformity of the film thickness will be described. FIG. 15 is a graph illustrating a relationship between the temperature of the shield ring 74' as a peripheral component and the in-plane uniformity of the film thickness. Herein, CO gas is used as the carrier gas, the flow rate of the CO gas is set to 100 sccm and the temperature of wafer is set to 190° C. As illustrated in FIG. 15, it may be understood that the in-plane uniformity of the film thickness deposited on the surface of the wafer tends to be bad when the temperature of the shield ring 74' is low, but the in-plane uniformity of the film thickness is improved with increasing the temperature of the shield ring. When the temperature of the shield ring is about 180° C., the in-plane uniformity of the film thickness is improved up to about 6%, and after that, even when the temperature of the shield ring is increased further, the in-plane uniformity of the film thickness is nearly saturated to be maintained at about 6%. Accordingly, it may be understood that shield ring 74' nearest to mounting platform main body 50 is preferably set to 180° C. or more.

Figure 16:
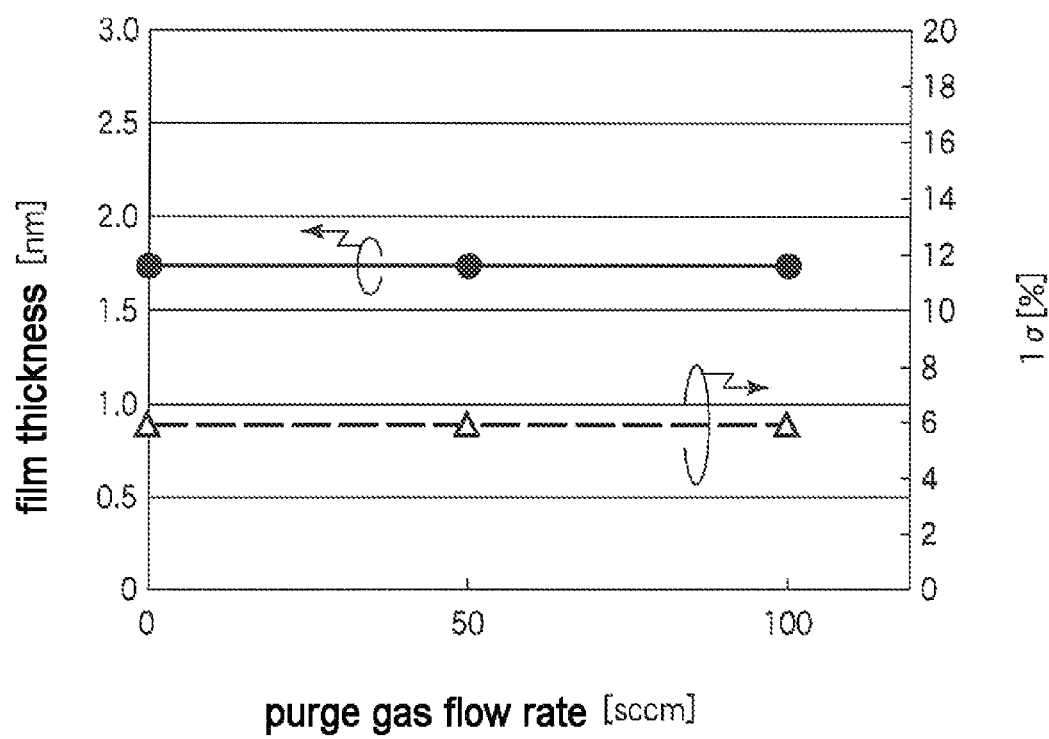
FIG. 16 is a graph illustrating a relationship between flow rate of the purge gas, film thickness and in-plane uniformity of film thickness in the deposition device, according to the third embodiment of the present invention.

Relationship Between Flow Rate of Purge Gas and in-Plane Uniformity of Film Thickness Next, the resultant film thickness and the in-plane uniformity of film thickness (1σ [%]) of the Ru film obtained when depositing a film while varying the flow rate of the purge gas using the deposition device of the third embodiment will be described with reference to FIG. 16. As illustrated in FIG. 16, it may be understood even when increasing the flow rate of the purge gas up to 100 sccm, the film thickness and the in-plane uniformity of the film thickness of the Ru film is not affected by the flow rate of the purge gas, so that it is possible to enhance the effect of preventing the unnecessary deposition of film.

Figure 17:
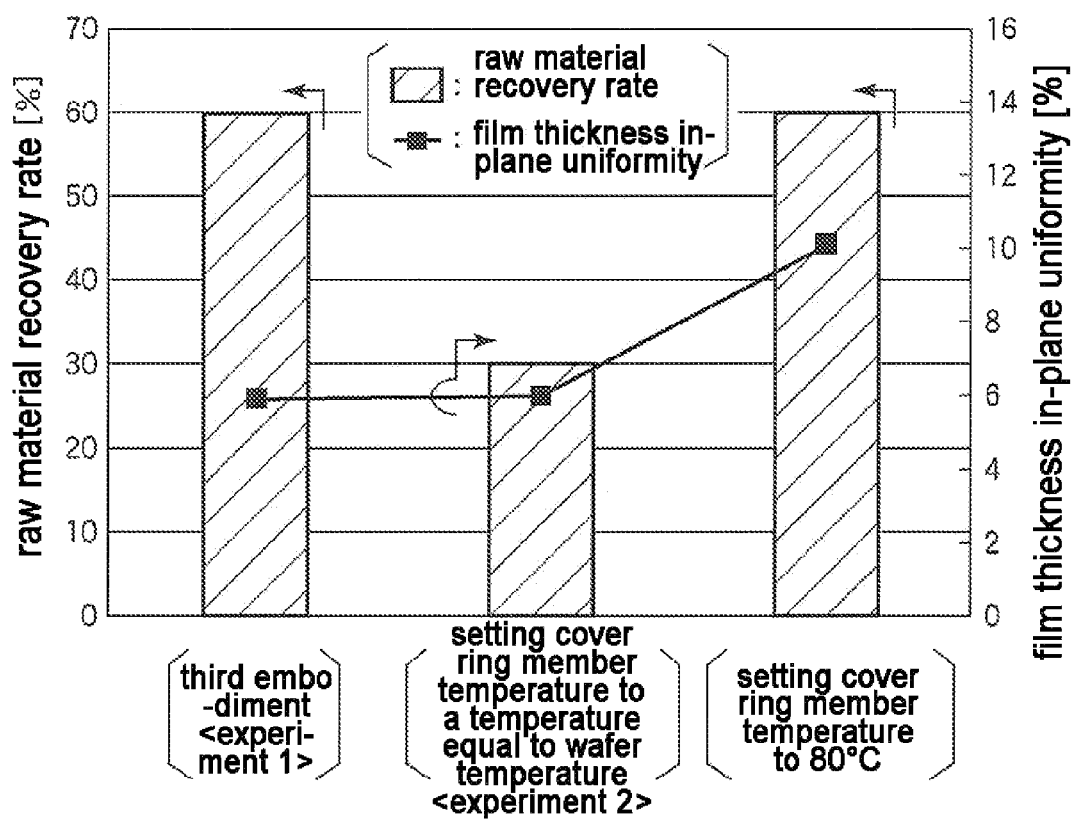
FIG. 17 is a graph illustrating a relationship between a recovery rate of raw material and in-plane uniformity of film thickness in a case where the temperature of the cover ring varies.

Relationship Between Recovery Rate of Raw Material and in-Plane Uniformity of Film Thickness in a Case where the Temperature of the Peripheral Components is Controlled Next, the results obtained from the investigation of the relationship between the recovery rate of raw material and the in-plane uniformity of film thickness in a case where the temperature of cover ring 76 as the peripheral component is varied will be described. FIG. 17 is a graph illustrating a relationship between a recovery rate of raw material and the in-plane uniformity of film thickness in a case where the temperature of cover ring 76 as a peripheral component of the mounting platform main body is varied. The wafer temperature was set to 190° C. in each experiment. The temperature of cover ring 76 is set to 170° C. in the experiment 1 which corresponds to the deposition method of the third embodiment, set to 190° C. which is the same temperature as the wafer temperature in experiment 2, and set to 80° C. in experiment 3. The respective temperatures of orifice forming member 116, internal partition wall 90 and cover member 164 are set to 80° C. in each of experiments 1, 2 and 3.

In the graph shown in FIG. 17, the left longitudinal axis and the right longitudinal axis represent the recovery rate of the raw material and in-plane uniformity of the film thickness, respectively. In experiment 1 corresponding to the deposition device of the third embodiment, the graph shows that the recovery rate of the raw material reaches up to 60% and the in-plane uniformity of the film thickness is about 6%, and thus, both values represent the good results. In contrast, in experiment 2 where the temperature of cover ring 76 is set to 190° C. which is the same as the temperature of the wafer, the in-plane uniformity of the film thickness is equivalent to that obtained in experiment 1, but, the recovery rate of the raw material has become a smaller value. In experiment 3 where the temperature of cover ring 76 is set to 80° C., it has been confirmed that the recovery rate of the raw material is almost the same as that in experiment 1, but the in-plane uniformity of the film thickness is deteriorated.

Recovery Rate of the Raw Material Under Various Conditions

Figure 18:
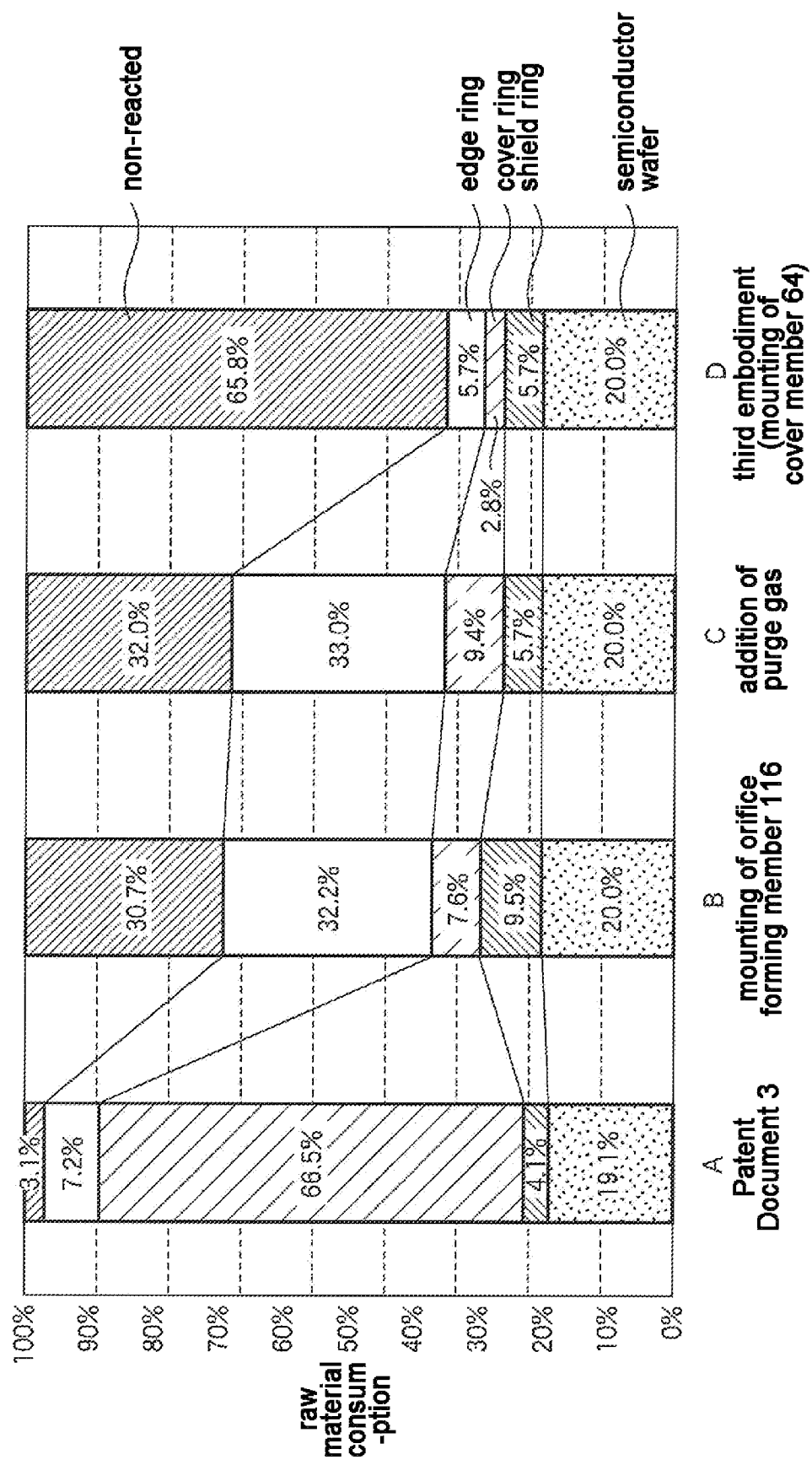
FIG. 18 is a graph illustrating results of adhesion of the source gas confirmed with respect to the deposition device of the Paten Document 3 and the deposition device, according to the third embodiment and two intermediate level deposition devices of the deposition devices.

Next, the recovery rate of raw material in the deposition device under various conditions was investigated. FIG. 18 is a graph illustrating the results obtained from confirmation of adhesion of the source gas with respect to the deposition device of Patent Document 3 and the deposition device according to the third embodiment, and two deposition devices corresponding to an intermediate level of the deposition devices of Patent Document 3 and the deposition device of the third embodiment. Herein, it is assumed that the temperatures of shield ring 74' and edge ring 58' of the mounting platform is to be increased to about 180° C. to about 190° C., the temperature of cover ring 76 is to be increased to 170° C. in advance, and the reference numeral A denotes the deposition device of Patent Document 3 in which orifice forming member 116 and cover member 164 are not installed and the purge gas is absent, the reference numeral B denotes the deposition device embodiment in which orifice forming member 116 is installed, the purge gas is absent and cover member 164 is not installed, the reference numeral C denotes the deposition device embodiment in which orifice forming member 116 is installed, the purge gas is present and cover member 164 is not installed, and the reference numeral D denotes the deposition device of the third embodiment.

As illustrated in FIG. 18, the following matters have been confirmed. In the deposition device of Patent Document 3, most of the source gas which did not contribute to the deposition of film on semiconductor wafer W was consumed for depositing the film on cover ring 76, so that the non-reacted source gas can be hardly recovered. In contrast, in the deposition device B in which orifice forming member 116 was installed, the amount of the source gas consumed for depositing of film on cover ring 76 was significantly reduced to increase the amount of the non-reacted source gas up to 30.7%. In the meantime, in the deposition device C in which the purge gas was introduced, the amount of the source gas consumed for depositing on shield ring 74' is reduced to increase the amount of the non-reacted source gas up to 32.0%. Further, in the deposition device of the third embodiment in which cover member 164 was installed, the deposition of the film on a rear surface of edge ring 58' was significantly reduced to increase the amount of the non-reacted source gas up to 65.8%.

As described above, according to the third embodiment, a high deposition rate and a further improved in-plane uniformity of the film thickness can be obtained and the deposition of the unnecessary film on the peripheral edge of mounting platform 28 can be suppressed to be smaller as well, so that the non-reacted source gas can be effectively recovered.

Further, in the first and the second embodiments, the temperature of the peripheral edge of mounting platform 28 is maintained at 80° C. at which a deposition reaction does not occur, so that it is possible to suppress the deposition of the unnecessary film and improve the recovery rate of the source gas.

Deposition Device According to Fourth Embodiment

Figure 19:
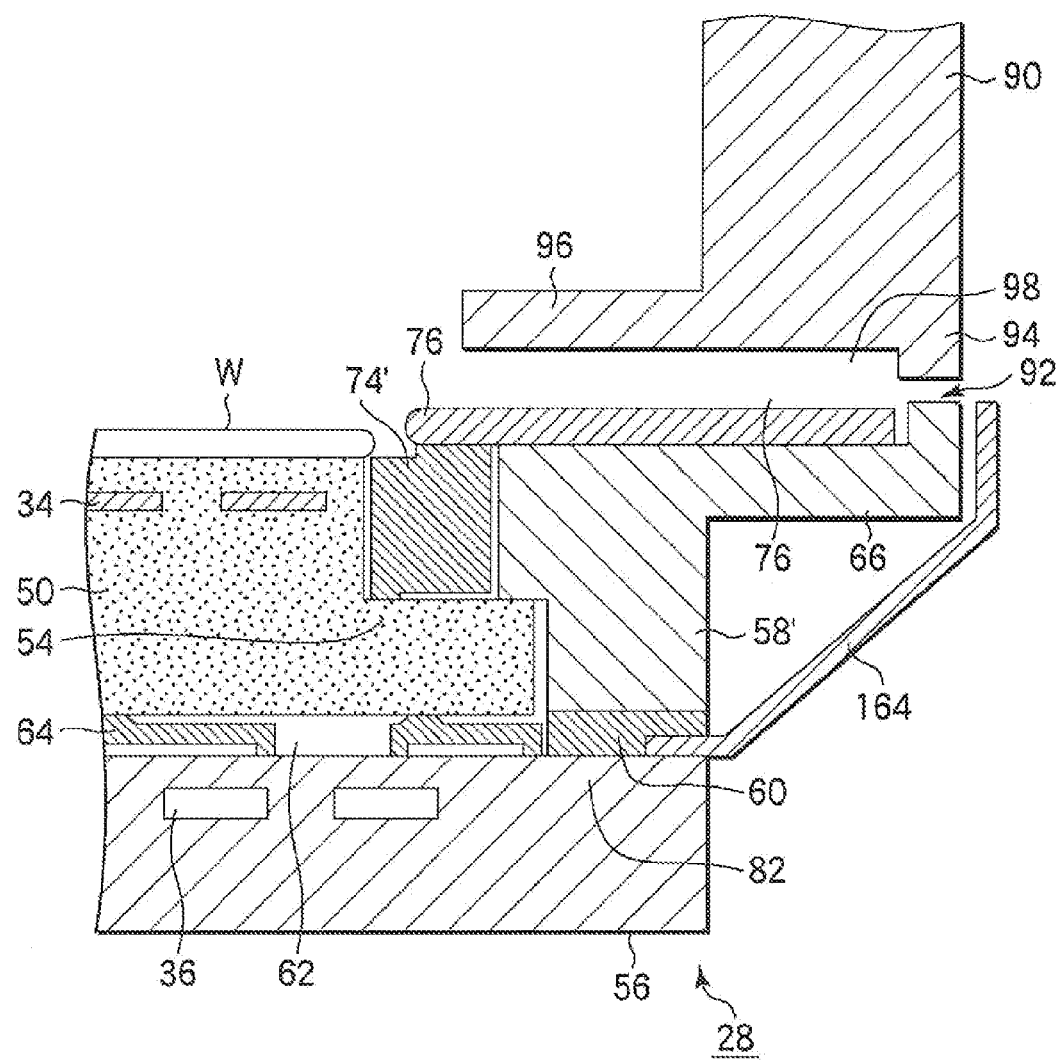
FIG. 19 is a partially enlarged cross-sectional view illustrating a portion of the mounting platform in a deposition device, according to a fourth embodiment of the present invention.

Next, the deposition device according to a fourth embodiment of the present invention will be described. FIG. 19 is a partially enlarged cross-sectional view illustrating a portion of the deposition device according to the fourth embodiment of the present invention. The fourth embodiment is configured with a combination of the first embodiment and the third embodiment, and the same reference numerals are given to the same elements and the description thereof will be simplified.

In the fourth embodiment, orifice forming member 96 made of the same material as the material of internal partition wall 90 is integrally formed with internal partition wall 90 at the lower end portion of orifice forming member 96 as in the first embodiment, and orifice 98 is formed between below orifice forming member 96 and the top surface of cover ring member 76 and forms gas outlet 92. Further, in the third embodiment, cover ring 76 is divided into inner peripheral ring 76A and outer peripheral ring 76B. However, in this embodiment, cover ring 76 is formed integrally as in the first embodiment, and the purge gas supply mechanism supplying the purge gas is not installed. Shield ring 74' and edge ring 58' are configured to be the same as those of the third embodiment, and the temperature settings are the same as those of the third embodiment.

Also in the fourth embodiment, as in the first embodiment, a portion of the source gas flowing-down toward an area outer side of outer peripheral end of wafer W corresponding to the periphery of mounting platform 28 travels and diffuses toward the central portion of processing space S in the middle of the flowing-down to stay there. Simultaneously, most of the source gas having been flowed-down comes in contact with orifice forming member 96 installed to be extended toward the central portion of processing space S at the lower end of internal partition wall 90, and deflects toward the central portion of processing space S. A portion of the source gas having been deflected stays in processing space S, while most of the source gas flows into orifice 98 of which the flow path area is made narrower and passes through gas outlet 92 to flow into a space formed at below mounting platform 28 in processing container 22 as indicated by the arrow 115. Further, as in the third embodiment, since the temperature of cover ring 76 is set to be slightly lower than the wafer temperature, the deposition of the film thereon is suppressed. Also, the deposition of the film on the outside of edge ring 58' is prevented by cover member 164 having a temperature of about 80° C. which is lower than the decomposition temperature of the source gas. Therefore, it is possible to increase the recovery rate of the raw material used for deposition by increasing the ratio of the source gas discharged with a non-reacted state.

Various modifications of the present invention may be made without being limited to the embodiments described above. For instance, in the embodiments described above, description is made regarding formation of the Ru film using, for example, $Ru_3(CO)_{12}$ as an organometallic compound. However, the present invention may use one of materials among $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, $Os_3(CO)_{12}$, $Ta(CO)_5$, tetrakisethylmethylaminotitanium (TEMAT), TAIMATA, $Cu(EDMDD)_2$, $TaCl_5$, Trimethylaluminium(TMA), tert-butylimido tris(diethylamido)tantalum (TBTDET), PentaEthoxyTantalum (PET), Tetramethylsilane (TMS), tetrakisethoxyhafnium (TEH), $Cp_2Mn[=Mn(C_5H_5)_2]$, $(MeCp)_2Mn[=Mn(CH_3C_5H_4)_2]$, $(EtCp)_2Mn[=Mn(C_2H_5C_5H_4)_2]$, $(i-PrCp)_2Mn[=Mn(C_3H_7C_5H_4)2]$, $MeCpMn(CO)_3[=CH_3C_5H_4)Mn(CO)_3]$, $(t-BuCp)_2Mn[=Mn(C_4H_9C_5H_4)_2]$, $CH_3Mn(CO)_5$, $Mn(DPM)_3[=Mn(C_{11}H_{19}O_2)_3]$, $Mn(DMPD)(EtCp)[=Mn(C_7H_{11}C_2H_5C_5H_4)]$, $Mn(acac)_2[=Mn(C_5H_7O_2)_2]$, $Mn(DPM)_2[=Mn(C_{11}H_{19}O_2)_2]$, $Mn(acac)_3[=Mn(C_5H_7O_2)_3]$, without being limited to the $Ru_3(CO)_{12}$.

In the above-described description, a semiconductor wafer is exemplified as a workpiece, but the semiconductor wafer includes GaAs, SiC and GaN compound semiconductor substrates in addition to Si semiconductor substrate. Further, the present invention may be applied to, for example, a glass substrate or a ceramic substrate used in a liquid crystal display apparatus, in addition to the semiconductor wafer.

What is claimed is:

1. A deposition device comprising:
   a processing container configured to accommodate a workpiece and be vacuum exhaustible in order to form a thin film on a surface of the workpiece using a source gas including an organometallic compound;
   a mounting platform accommodated in the processing container and configured to mount the workpiece, the mounting platform being equipped with a heater for heating the workpiece;
   a gas introduction mechanism including a baffle plate disposed above the mounting platform to be opposed thereto and configured to introduce the source gas toward an area further outside than an outer peripheral end of the workpiece on the mounting platform;
   an internal partition wall that surrounds a processing space above the mounting platform to form a boundary for the processing space and installed such that a lower end portion of the internal partition wall comes close to the mounting platform to form a gas outlet between the lower end portion of the internal partition wall and a peripheral edge of a top surface of the mounting platform; and
   an orifice forming member installed on the lower end portion of the internal partition wall surrounding the processing space to extend toward a central portion of the processing space to form an orifice communicating with the gas outlet between the internal partition wall and the peripheral edge of the top surface of the mounting platform.

2. The deposition device of claim 1, wherein a horizontal distance between an inner peripheral end of the orifice forming member and an outer peripheral end of the workpiece mounted on the mounting platform is 0 mm to 10 mm.

3. The deposition device of claim 1, wherein the internal partition wall and the orifice forming member are maintained at a temperature less than a decomposition temperature of the source gas and equal to or higher than a solidification temperature or a liquefaction temperature.

4. The deposition device of claim 1, wherein the gas introduction mechanism includes;
   a gas discharge port formed at a location corresponding to area further outside than the outer peripheral end of the workpiece mounted on the mounting platform in the peripheral edge of the baffle plate.

5. The deposition device of claim 1, wherein the peripheral edge of the mounting platform is maintained at a temperature lower than a decomposition temperature of the source gas and equal to or higher than a solidification temperature or a liquefaction temperature.

6. The deposition device of claim 1, wherein the organometallic compound is made of a material selected from a group consisting of $Ru_3(CO)_{12}$, $W(CO)_6$, $Ni(CO)_4$, $Mo(CO)_6$, $CO_2(CO)_8$, $Rh_4(CO)_{12}$, $Re_2(CO)_{10}$, $Cr(CO)_6$, $Os_3(CO)_{12}$, $Ta(CO)_5$, tetrakisethylmethylaminotitanium (TEMAT), TAIMATA, $Cu(EDMDD)_2$, $TaCl_5$, Trimethylaluminium(TMA), tert-butylimido tris(diethylamido)tantalum (TBTDET), PentaEthoxyTantalum (PET), Tetramethylsilane (TMS), tetrakisethoxyhafnium (TEH), $Cp_2Mn[=Mn(C_5H_5)_2]$, $(MeCp)_2Mn[=Mn(CH_3C_5H_4)_2]$, $(EtCp)_2Mn[=Mn$ $(C_2H_5C_5H_4)_2$], (i-PrCp)$_2$Mn[=Mn(C$_3$H$_7$C$_5$H$_4$)$_2$], MeCpMn(CO)$_3$[=(CH$_3$C$_5$H$_4$)Mn(CO)$_3$], (t-BuCp)$_2$Mn[=Mn(C$_4$H$_9$C$_5$H$_4$)$_2$], CH$_3$Mn(CO)$_5$, Mn(DPM)$_3$[=Mn(C$_{11}$H$_{19}$O$_2$)$_3$], Mn(DMPD)(EtCp)[=Mn(C$_7$H$_{11}$C$_2$H$_5$C$_5$H$_4$)], Mn(acac)$_2$[=Mn(C$_5$H$_7$O$_2$)$_2$], Mn(DPM)$_2$[=Mn(C$_{11}$H$_{19}$O$_2$)$_2$], Mn(acac)$_3$[=Mn(C$_5$H$_7$O$_2$)$_3$].

\* \* \* \* \*